(12) United States Patent
Chung et al.

(10) Patent No.: US 9,922,979 B2
(45) Date of Patent: Mar. 20, 2018

(54) INTEGRATED CIRCUIT DEVICE AND METHOD OF MANUFACTURING THE SAME

(71) Applicants: Jae-yup Chung, Yongin-si (KR); Jong-shik Yoon, Yongin-si (KR); Hwa-sung Rhee, Seongnam-si (KR); Hee-don Jeong, Hwaseong-si (KR); Je-Min Yoo, Suwon-si (KR); Kyu-man Cha, Busan (KR); Jong-mil Youn, Yongin-si (KR); Hyun-jo Kim, Seoul (KR)

(72) Inventors: Jae-yup Chung, Yongin-si (KR); Jong-shik Yoon, Yongin-si (KR); Hwa-sung Rhee, Seongnam-si (KR); Hee-don Jeong, Hwaseong-si (KR); Je-Min Yoo, Suwon-si (KR); Kyu-man Cha, Busan (KR); Jong-mil Youn, Yongin-si (KR); Hyun-jo Kim, Seoul (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 0 days.

(21) Appl. No.: 15/014,928

(22) Filed: Feb. 3, 2016

(65) Prior Publication Data
US 2016/0284706 A1  Sep. 29, 2016

(30) Foreign Application Priority Data
Mar. 25, 2015 (KR) .......................... 10-2015-0041645

(51) Int. Cl.
*H01L 29/78* (2006.01)
*H01L 27/092* (2006.01)
(Continued)

(52) U.S. Cl.
CPC .... *H01L 27/0924* (2013.01); *H01L 21/76229* (2013.01); *H01L 21/76232* (2013.01);
(Continued)

(58) Field of Classification Search
CPC ......... H01L 21/76229; H01L 21/76232; H01L 21/823821; H01L 21/823878;
(Continued)

(56) References Cited

U.S. PATENT DOCUMENTS 8,680,625 B2   3/2014  Fan et al.
8,691,654 B2   4/2014  Satoh et al.
(Continued)

FOREIGN PATENT DOCUMENTS

JP   2007-227721 A   9/2007
JP   2008-098469 A   4/2008
JP   2010-135433 A   6/2010

*Primary Examiner* — Fazli Erdem
(74) *Attorney, Agent, or Firm* — Harness, Dickey & Pierce, P.L.C.

(57) ABSTRACT

An integrated circuit (IC) device includes a fin-type active region formed in a substrate, a step insulation layer on at least one sidewall of the fin-type active region, and a first high-level isolation layer on the at least one sidewall of the fin-type active region. The fin-type active region protrudes from the substrate and extending in a first direction parallel to a main surface of the substrate, includes a channel region having a first conductivity type, and includes the stepped portion. The step insulation layer contacts the stepped portion of the fin-type active region. The step insulation layer is between the first high-level isolation layer and the at least one sidewall of the fin-type active region. The first high-level isolation layer extends in a second direction that is different from the first direction.

20 Claims, 42 Drawing Sheets

(51) Int. Cl.
   *H01L 27/088*    (2006.01)
   *H01L 27/02*     (2006.01)
   *H01L 21/762*    (2006.01)
   *H01L 21/8238*   (2006.01)

(52) U.S. Cl.
   CPC ........... *H01L 21/823821* (2013.01); *H01L 21/823878* (2013.01); *H01L 27/0207* (2013.01); *H01L 27/0886* (2013.01); *H01L 29/7846* (2013.01); *H01L 21/82385* (2013.01)

(58) Field of Classification Search
   CPC ............ H01L 27/0207; H01L 27/0886; H01L 27/0924; H01L 29/78; H01L 29/7846
   See application file for complete search history.

(56) References Cited

U.S. PATENT DOCUMENTS

| | | | |
|---|---|---|---|
| 9,570,442 B1* | 2/2017 | Liu | H01L 27/0886 |
| 2011/0127610 A1* | 6/2011 | Lee | H01L 21/823431 257/365 |
| 2014/0048856 A1 | 2/2014 | Song et al. | |
| 2014/0117425 A1* | 5/2014 | Pradhan | H01L 29/7843 257/288 |
| 2014/0151766 A1* | 6/2014 | Eneman | H01L 29/1054 257/288 |
| 2014/0264572 A1 | 9/2014 | Kim et al. | |
| 2014/0353763 A1 | 12/2014 | Chung et al. | |
| 2016/0247876 A1* | 8/2016 | Chung | H01L 29/0649 |

\* cited by examiner

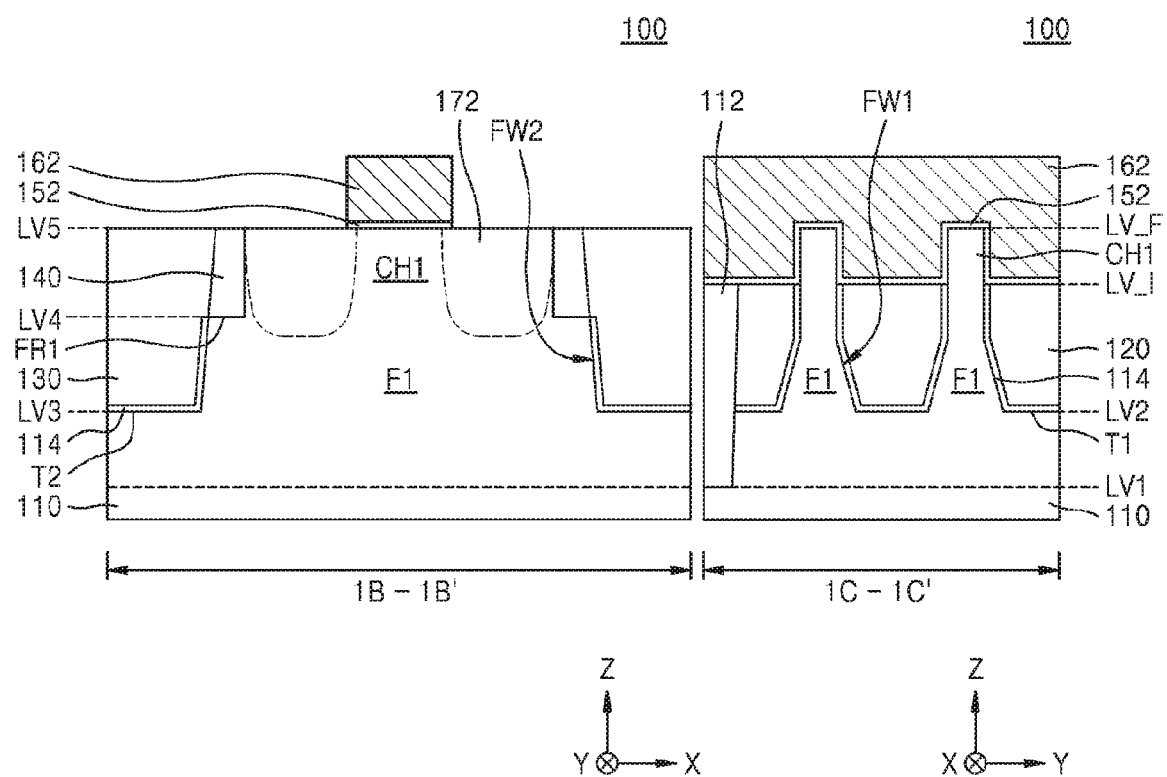

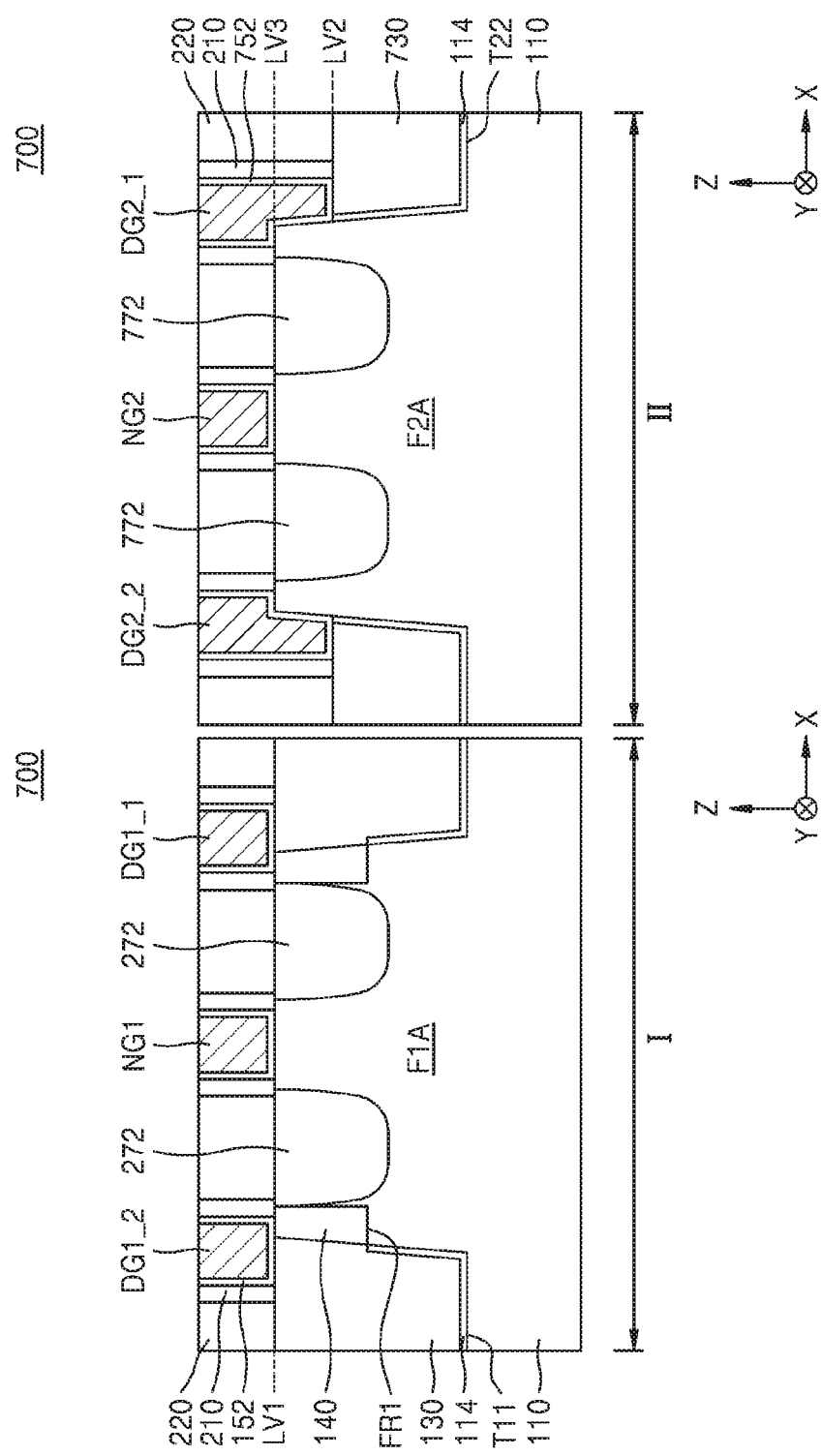

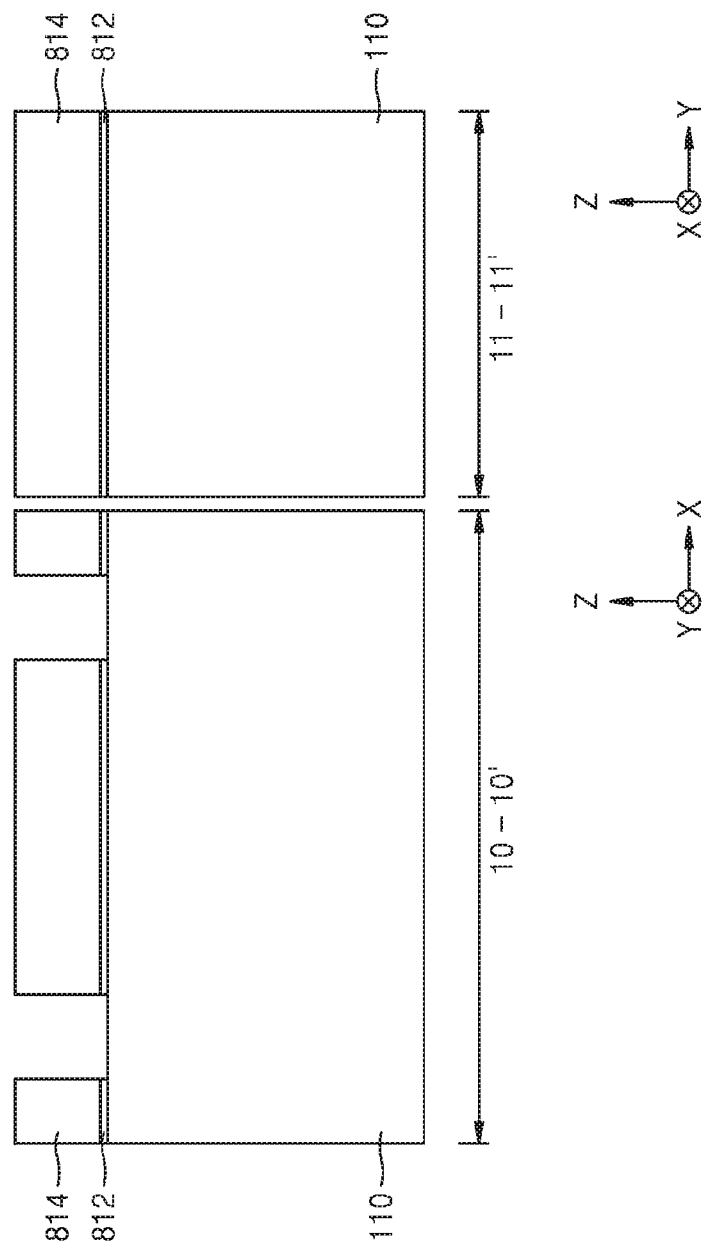

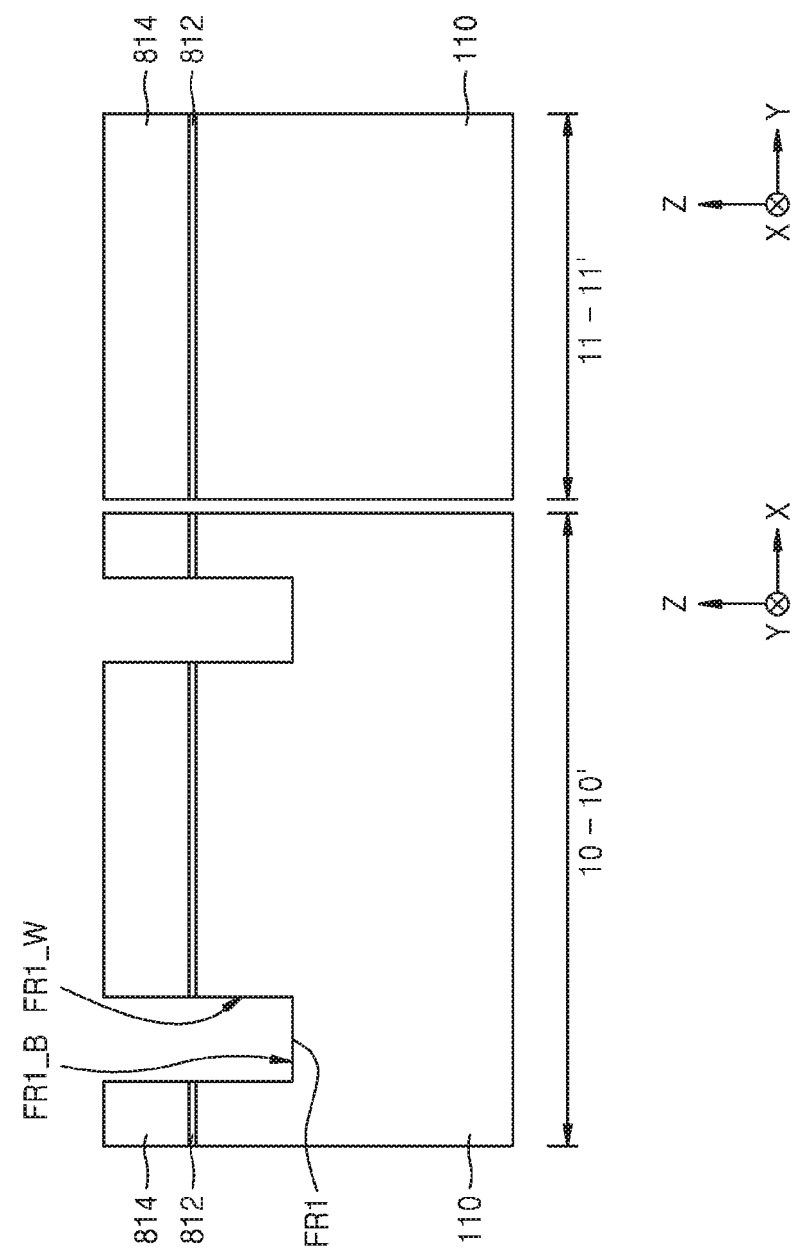

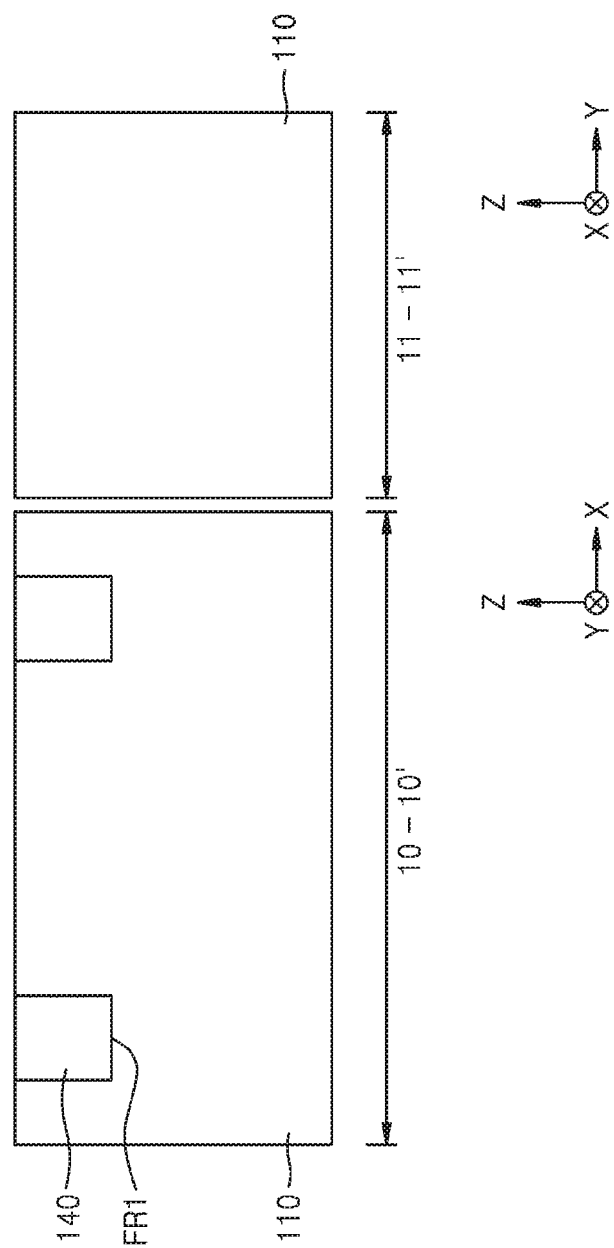

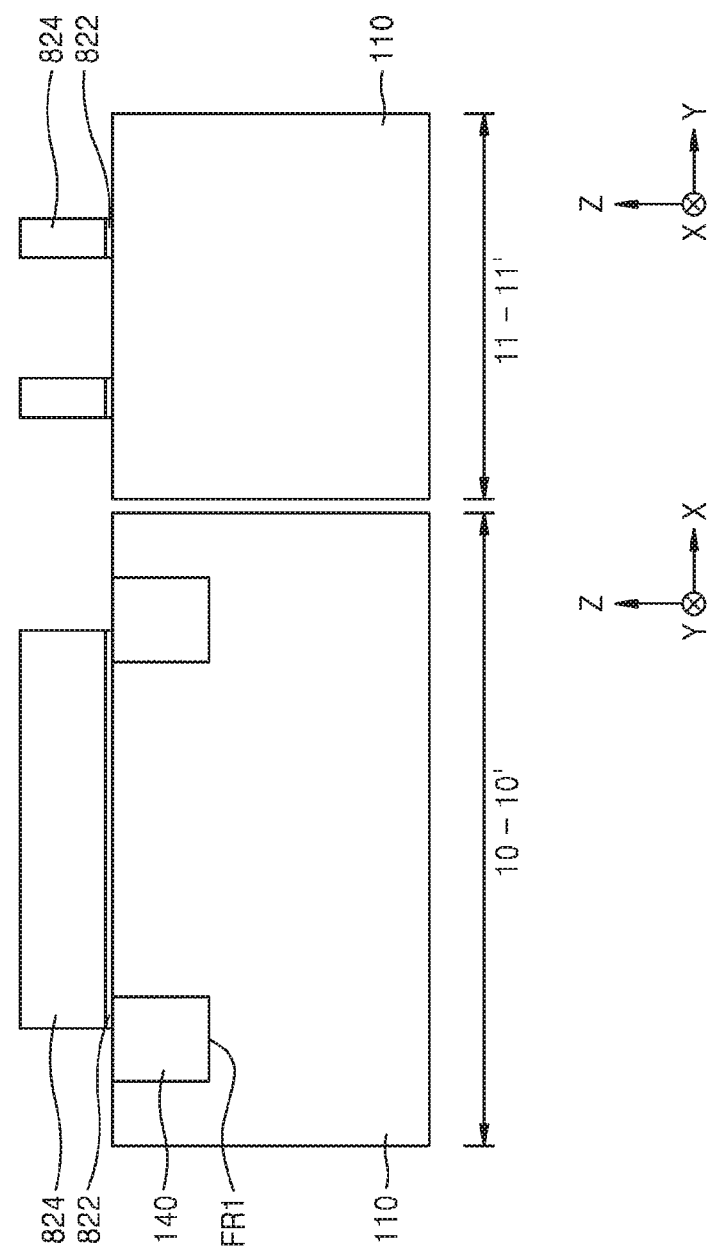

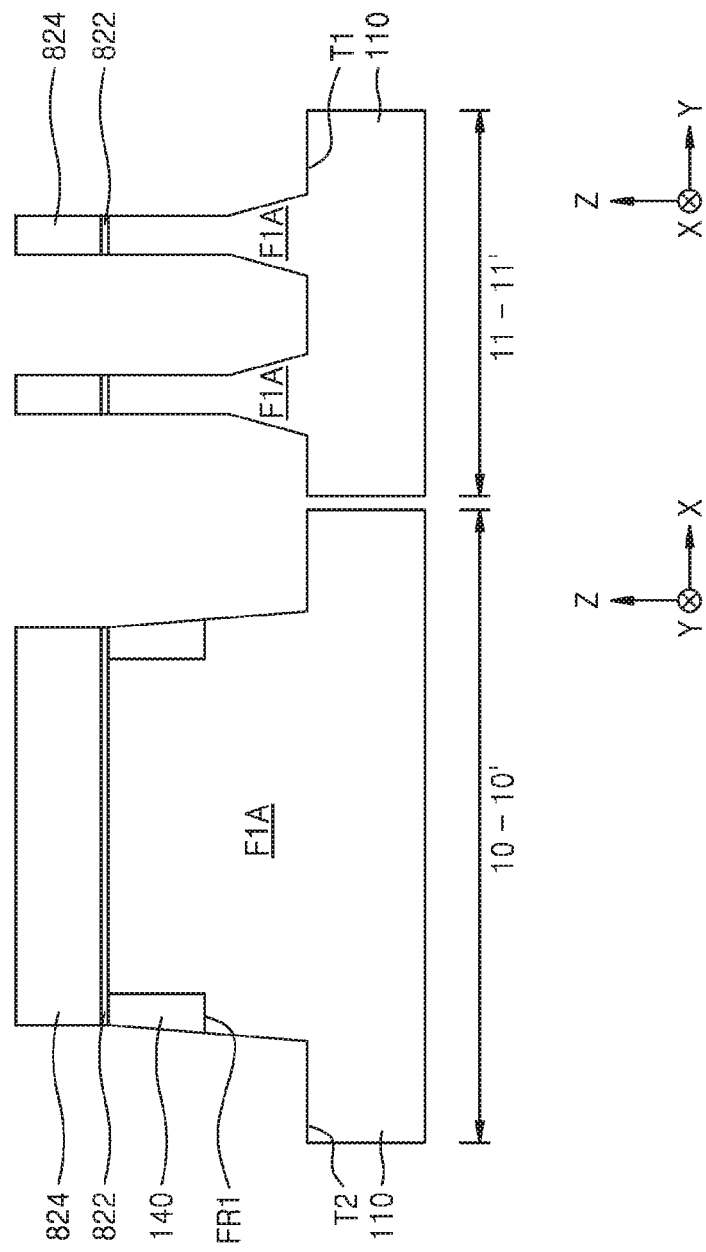

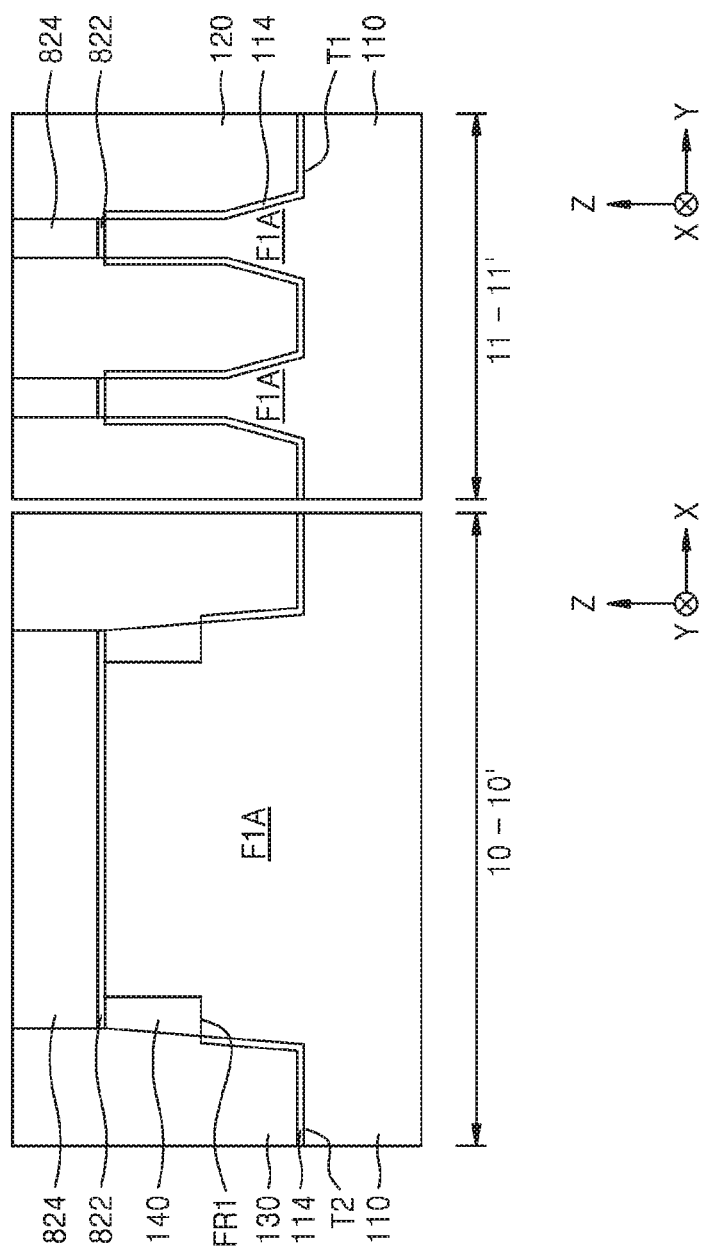

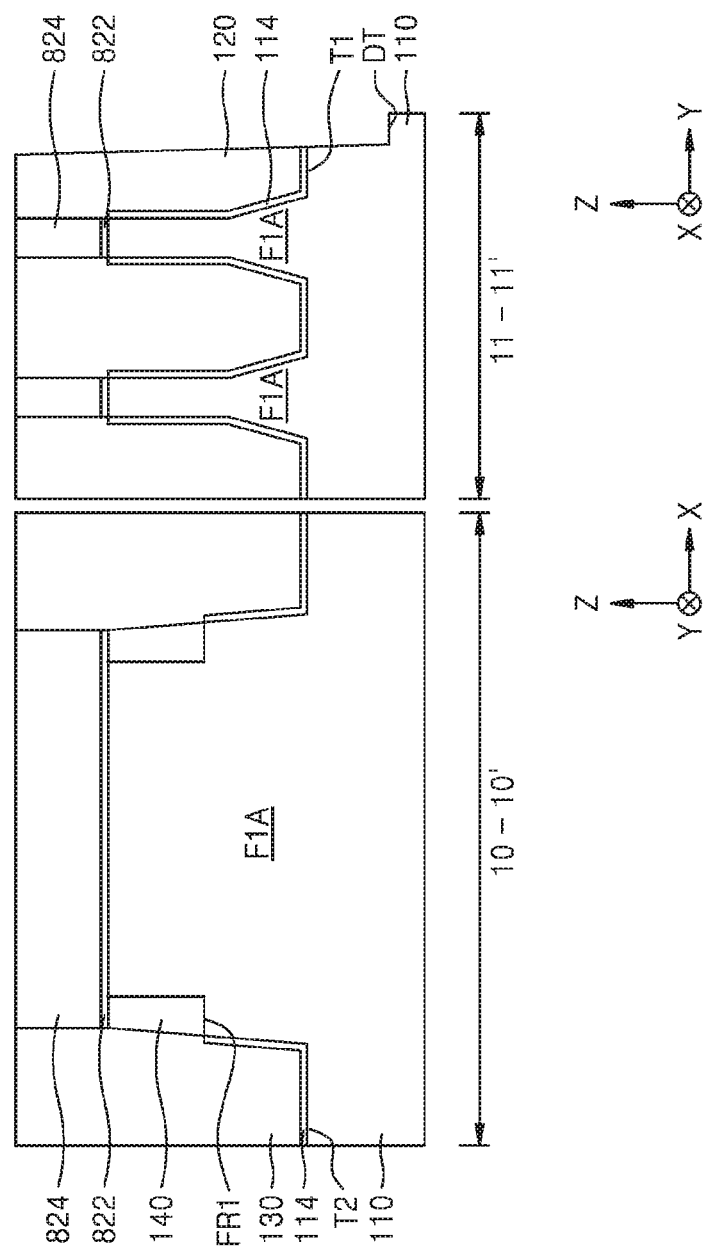

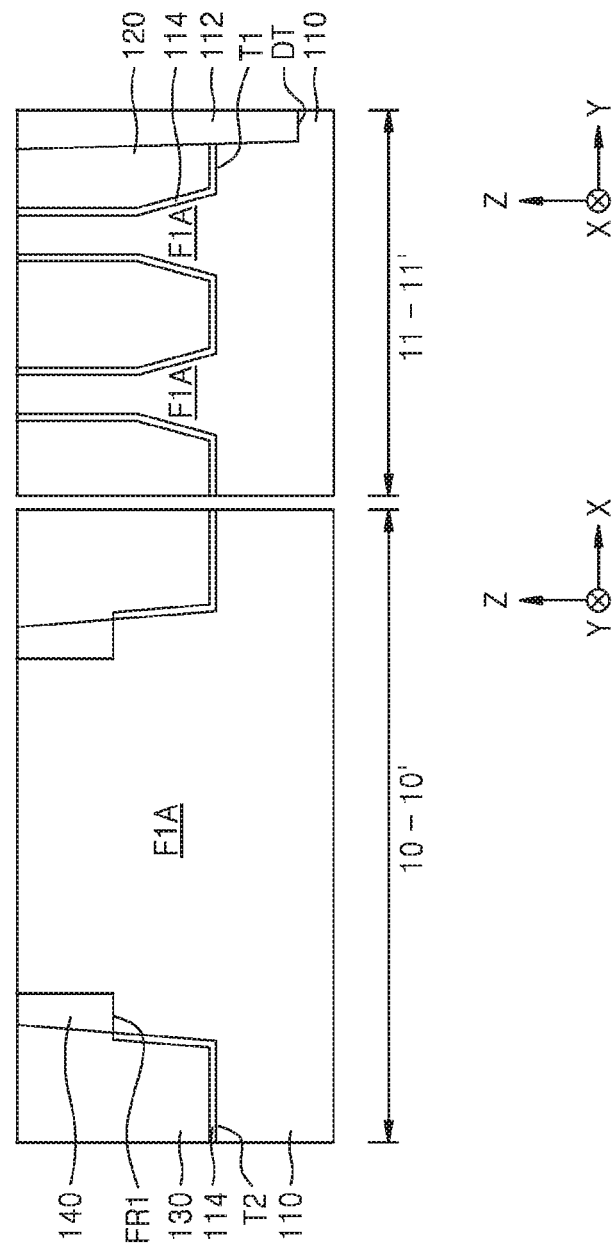

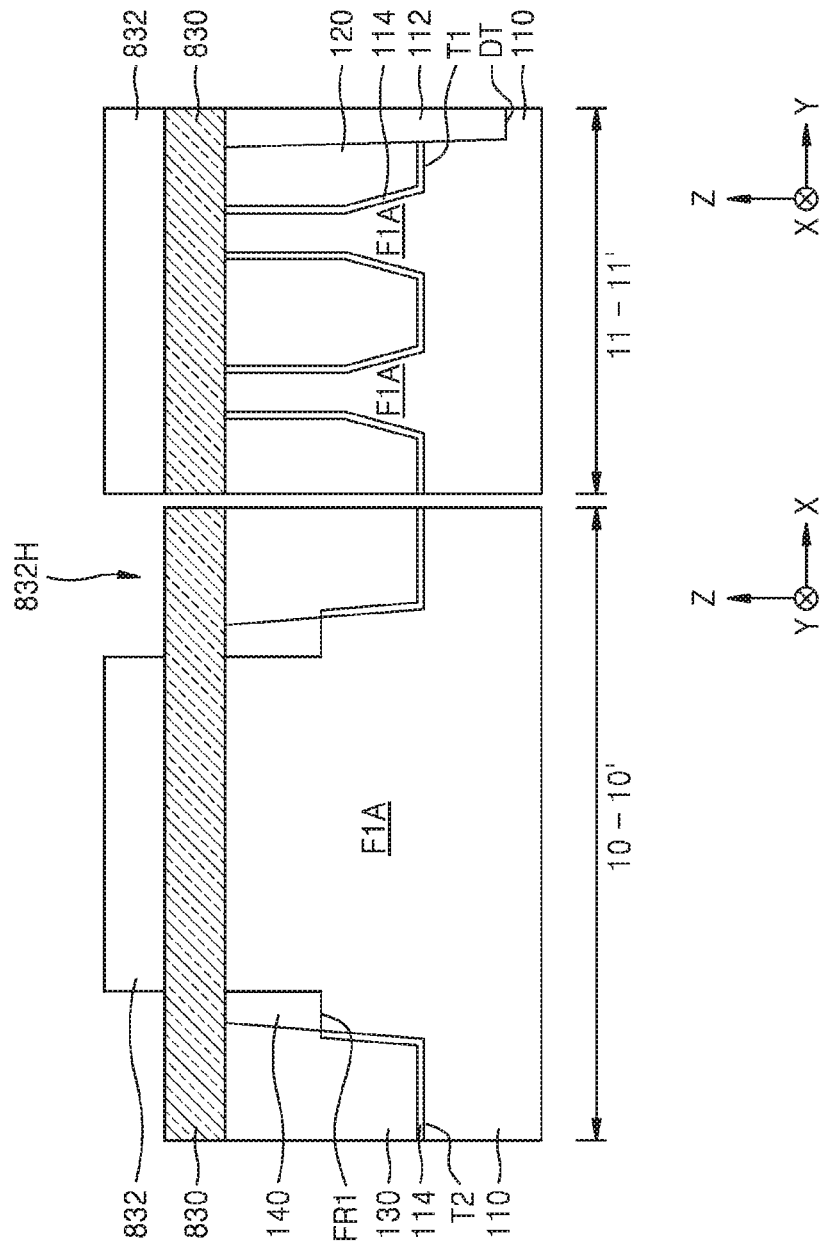

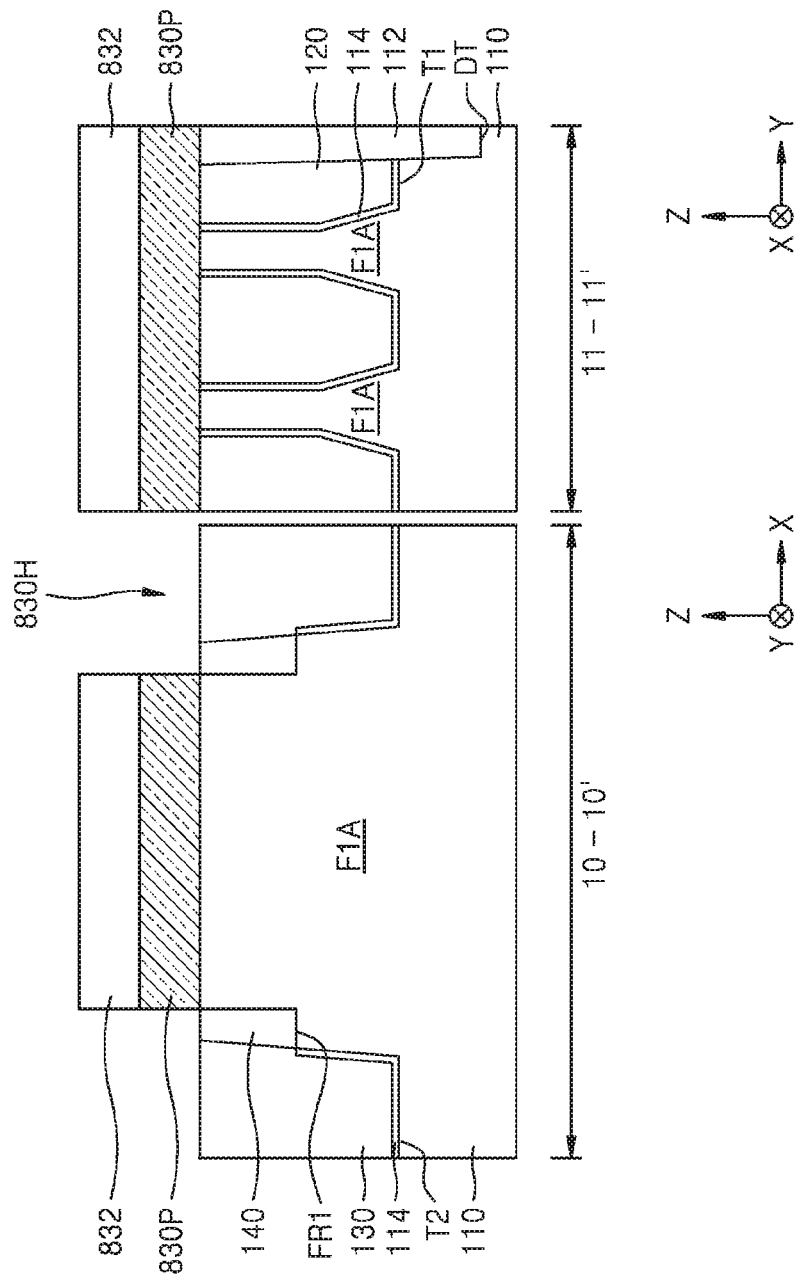

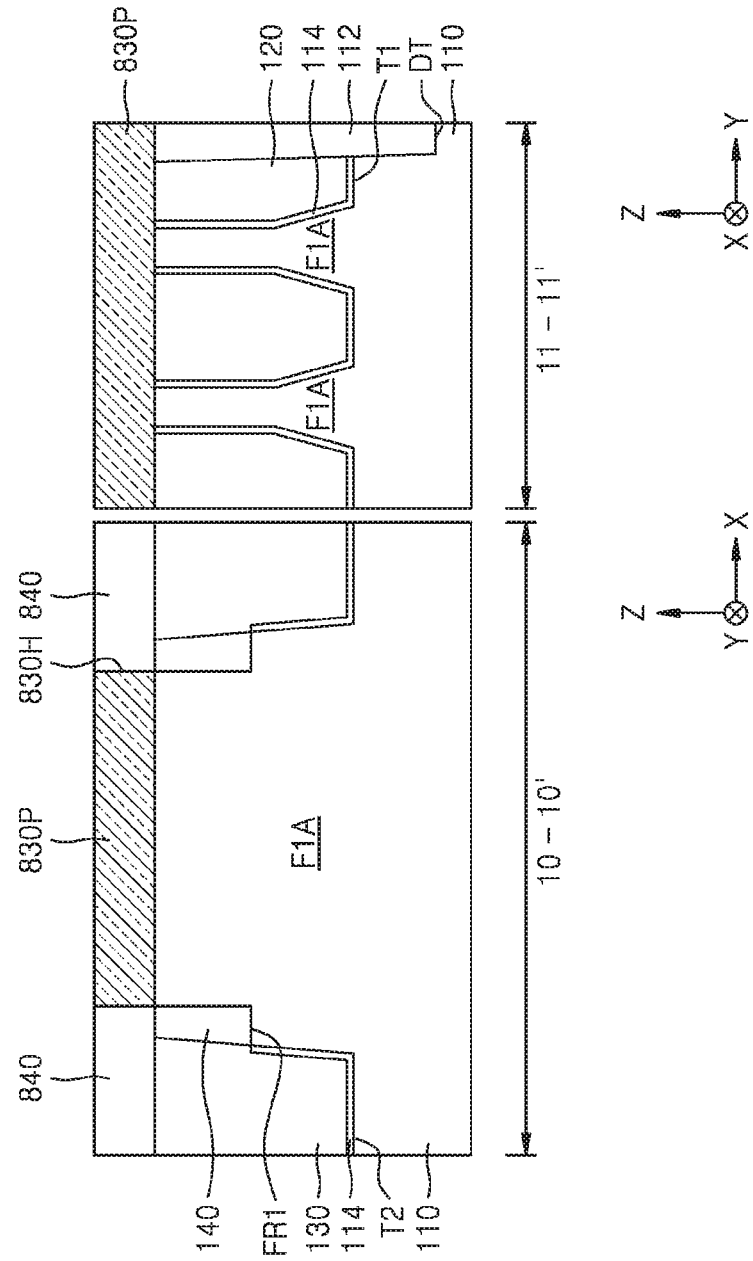

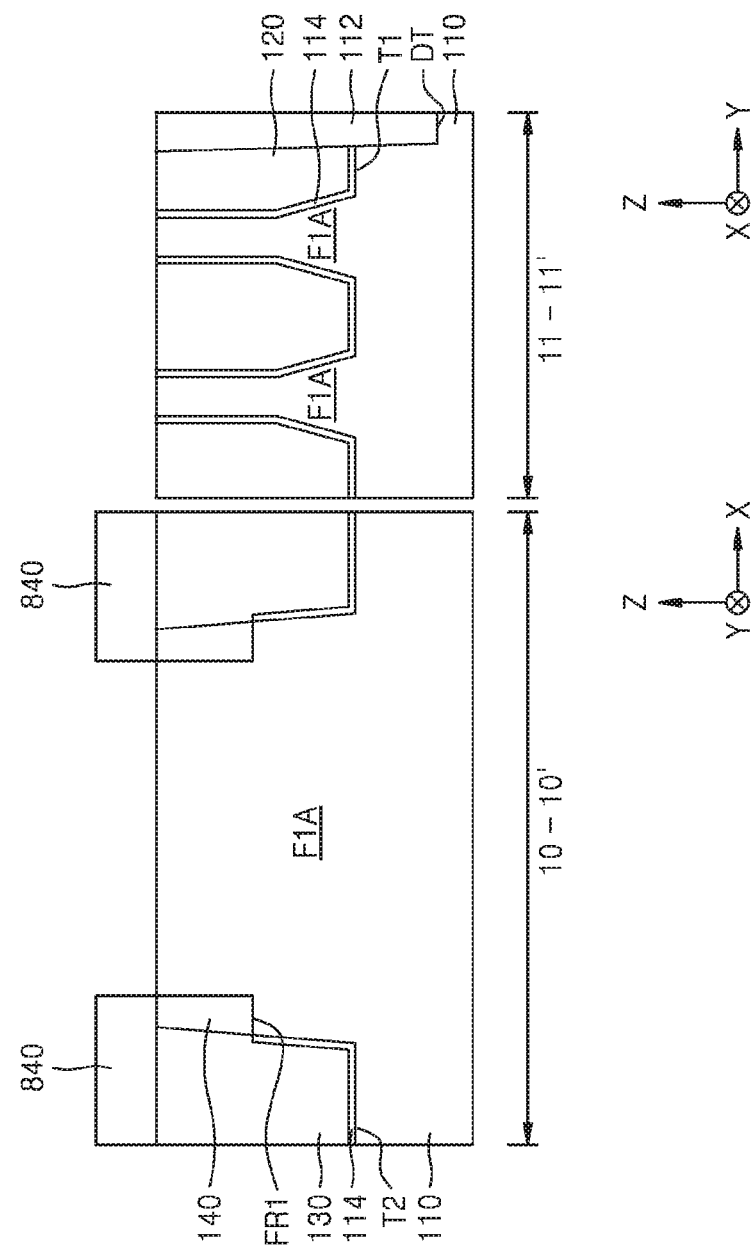

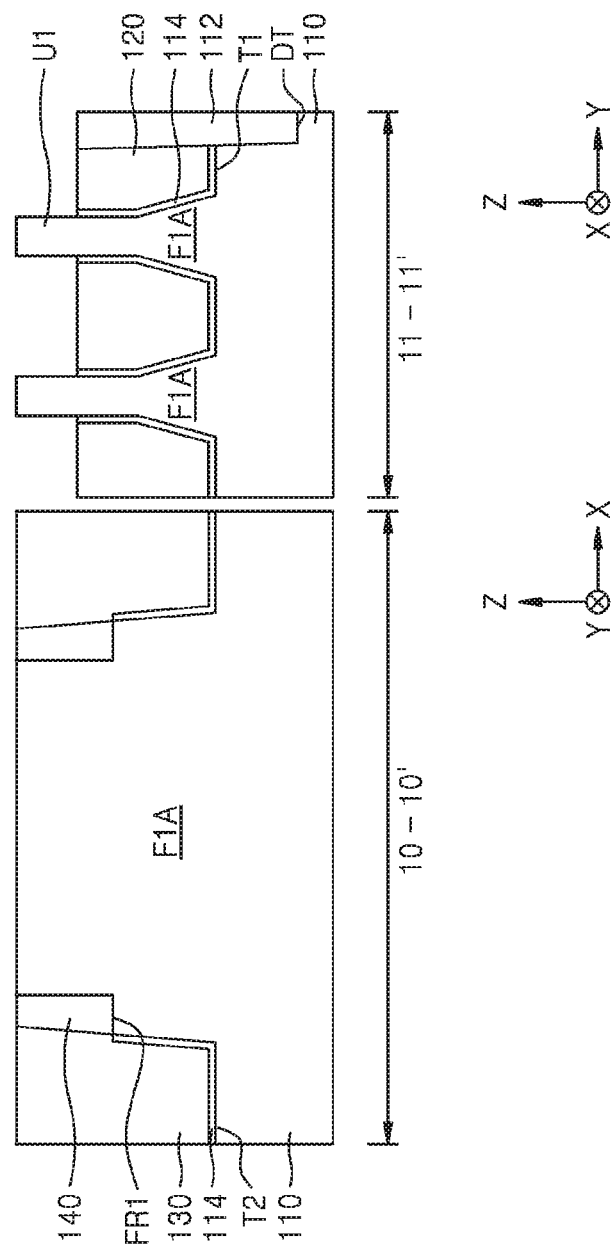

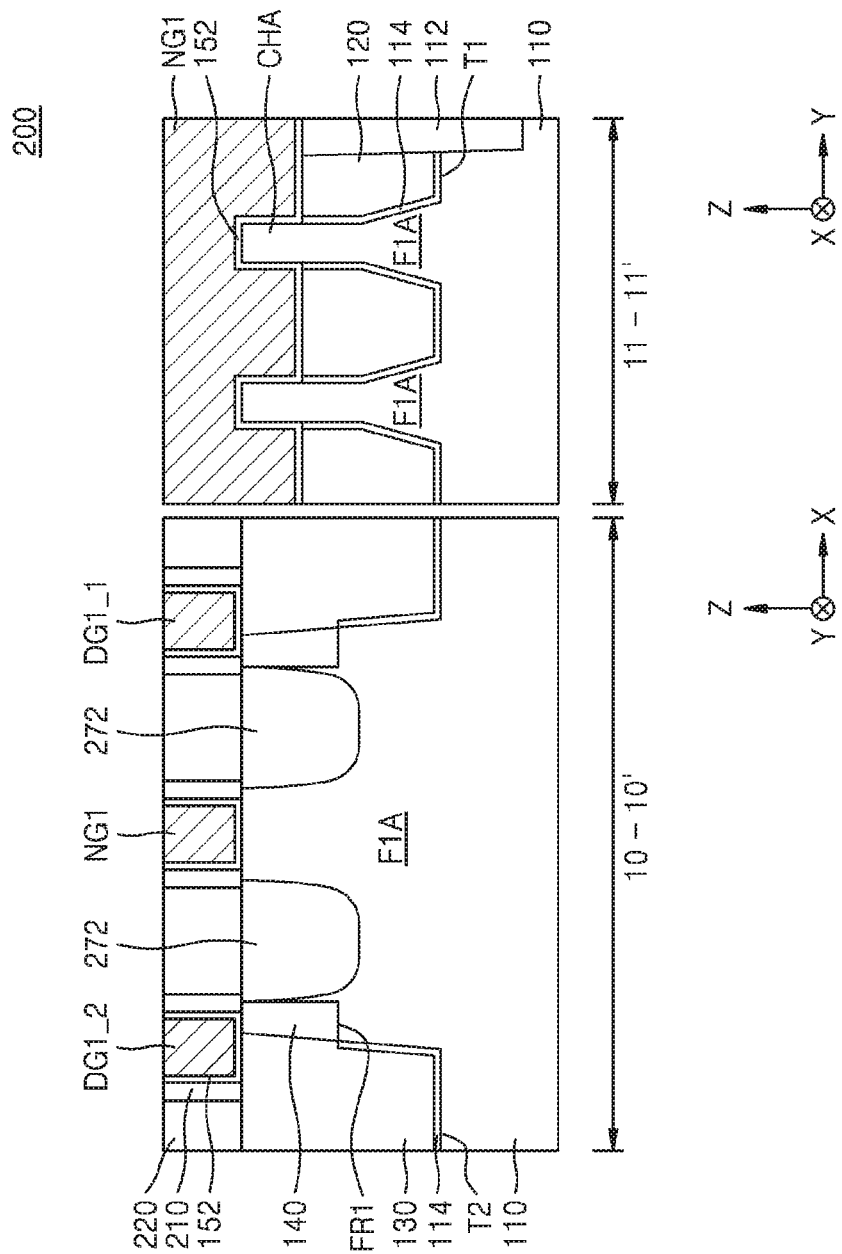

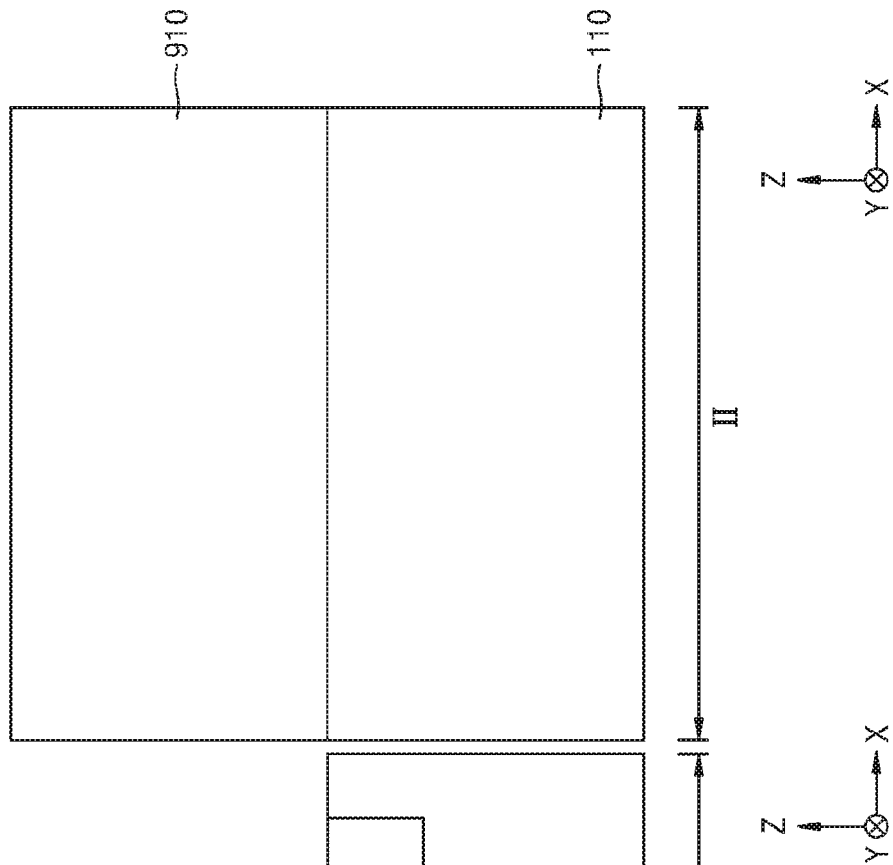

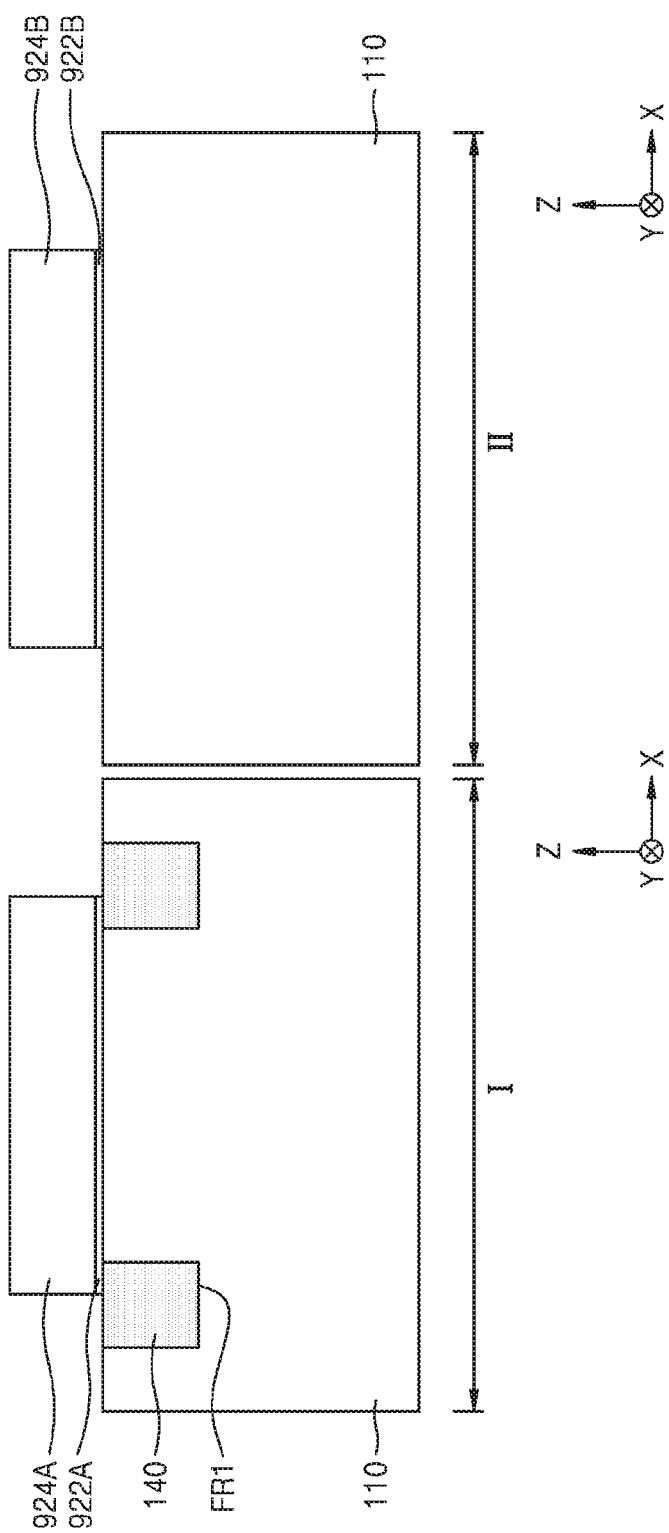

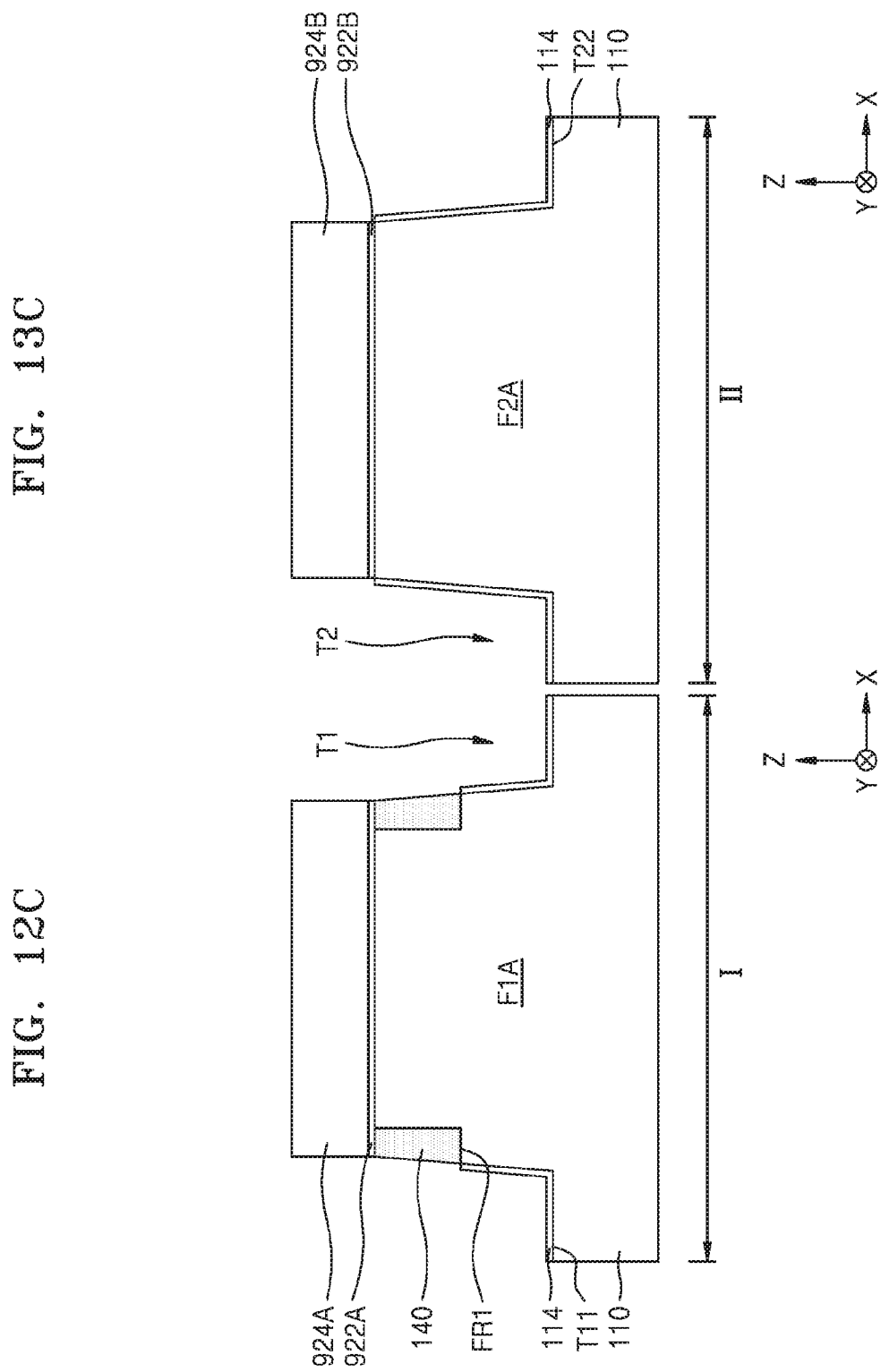

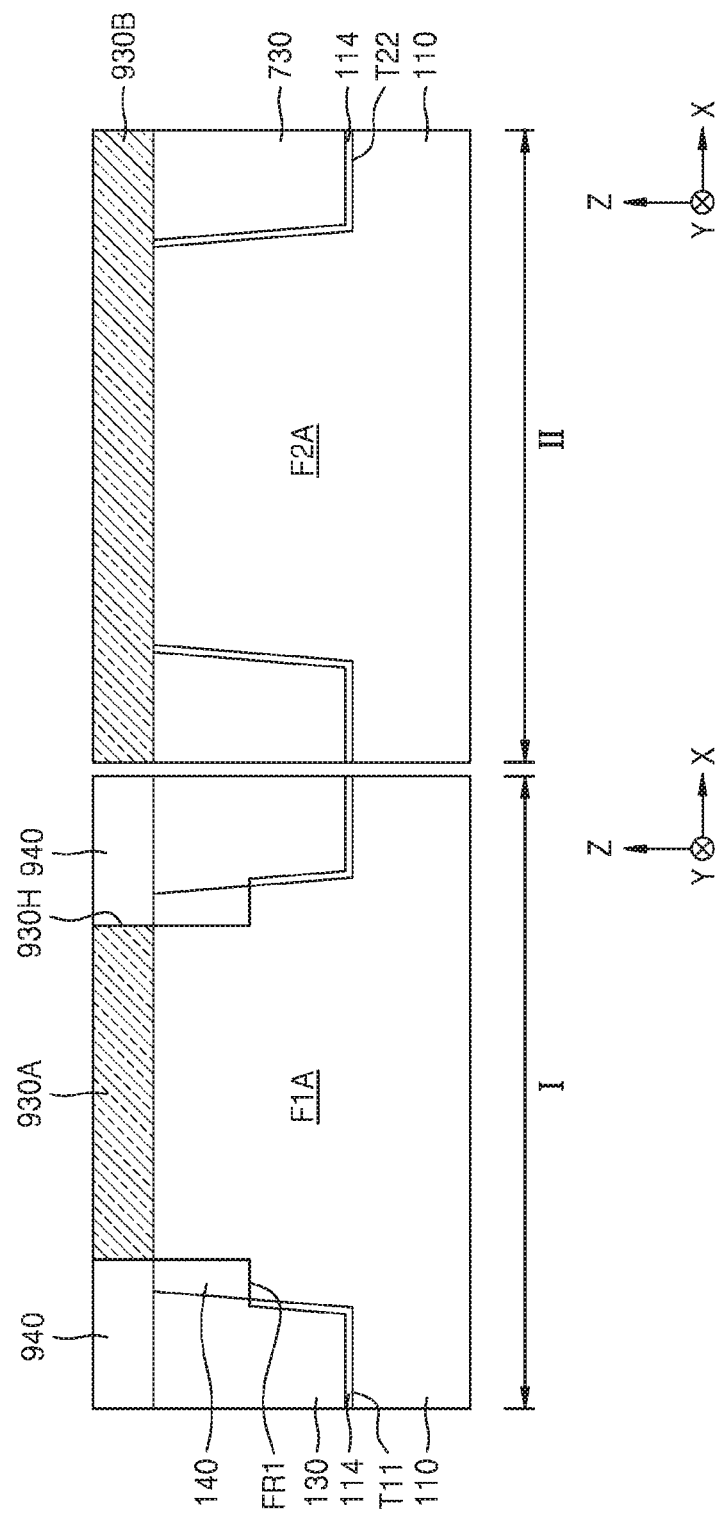

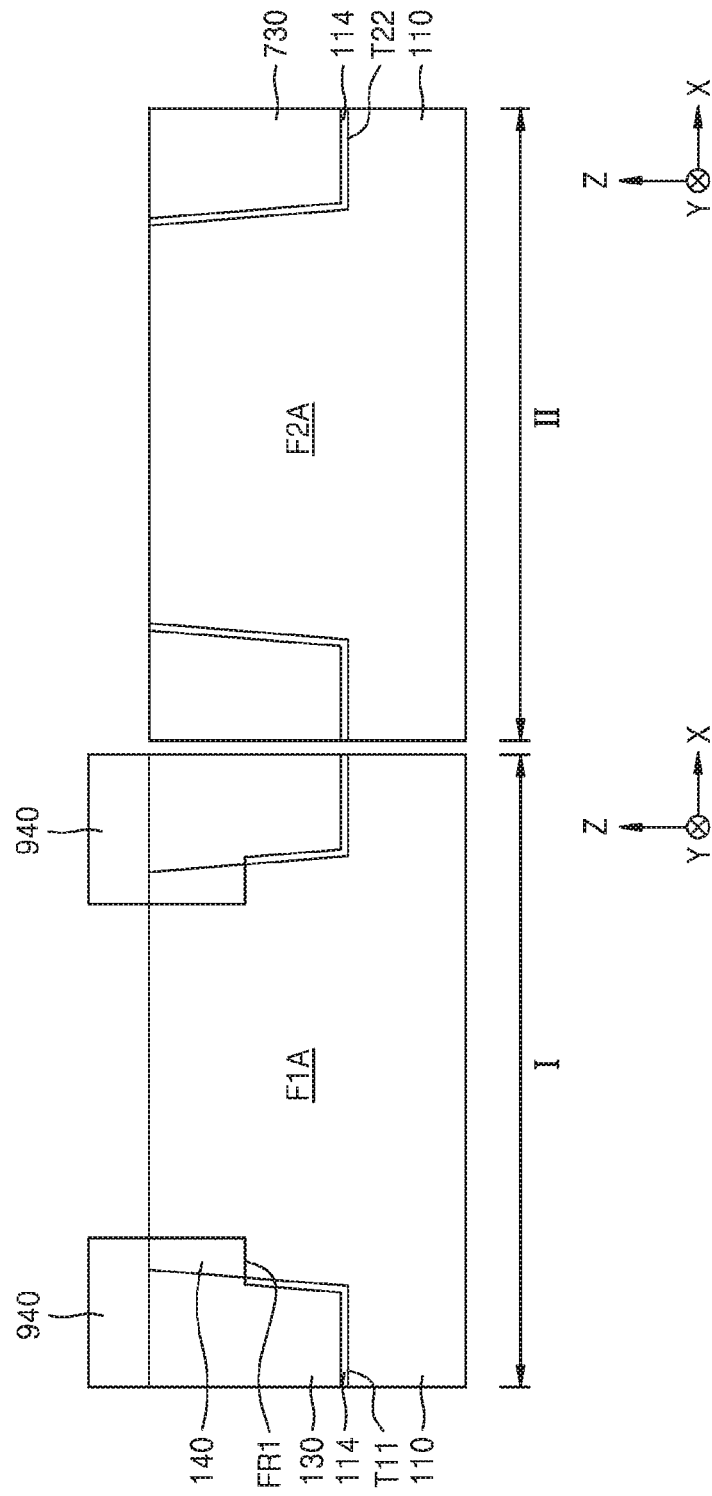

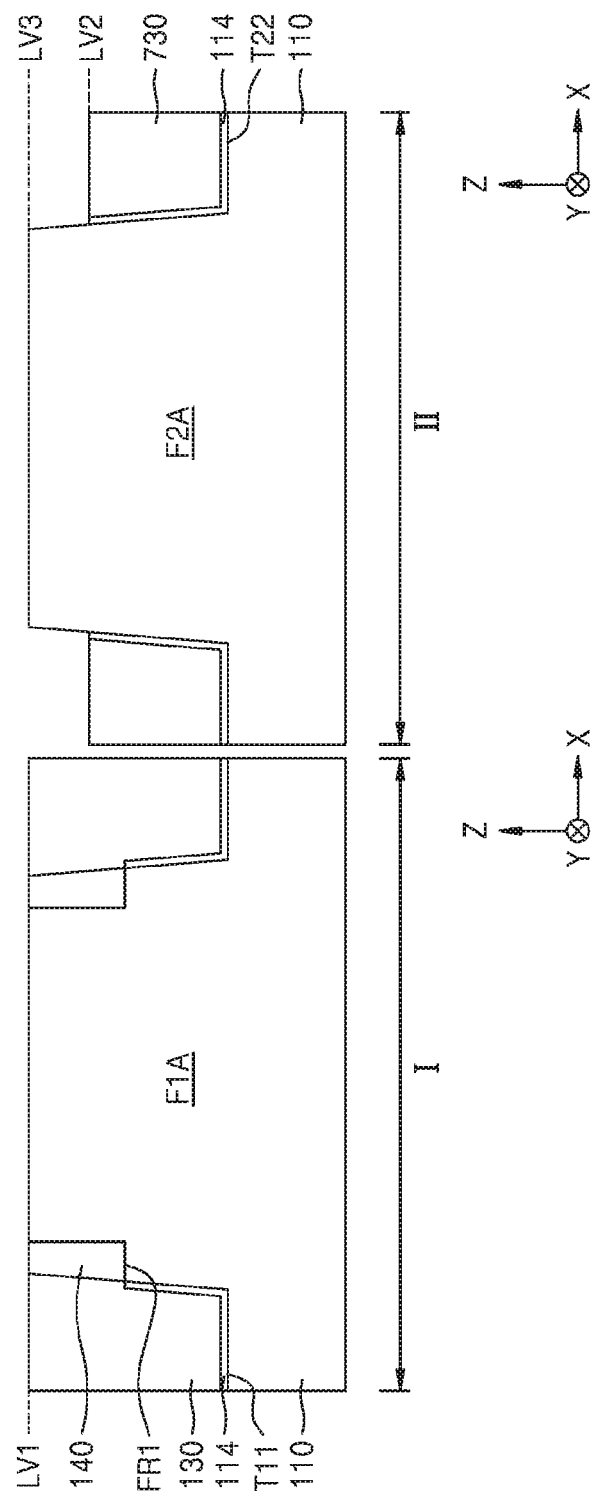

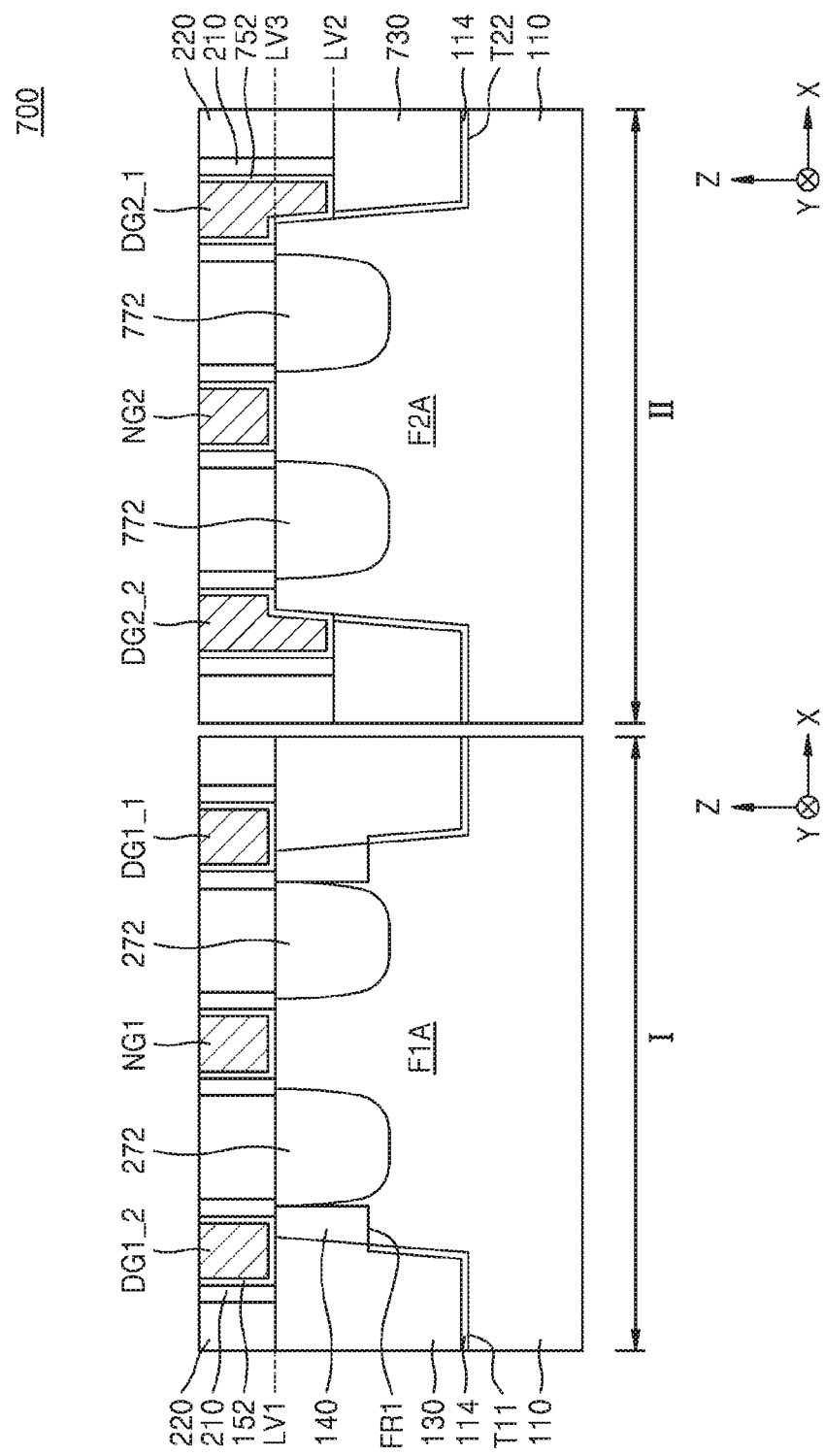

INTEGRATED CIRCUIT DEVICE AND METHOD OF MANUFACTURING THE SAME

CROSS-REFERENCE TO RELATED APPLICATION

This application claims priority under 35 U.S.C. § 119 to Korean Patent Application No. 10-2015-0041645, filed on Mar. 25, 2015 in the Korean Intellectual Property Office, the disclosure of which is incorporated herein in its entirety by reference.

BACKGROUND

The present disclosure relates to an integrated circuit (IC) device and/or a method of manufacturing the same, and more particularly, to an IC device including a fin field effect transistor (FinFET) and/or a method of manufacturing the IC device.

Semiconductor devices included in electronic devices have been downscaled to form high-speed electronic devices. As a technique of downscaling the semiconductor devices, a FinFET including a gate formed on a fin protruding from a substrate has been proposed. In the FinFET fin is used as a three-dimensional (3D) channel.

SUMMARY

The present disclosure relates to an integrated circuit (IC) device having improved performance.

The present disclosure also relates a method of manufacturing the IC device.

According to example embodiments of inventive concepts, an IC device includes a substrate including a fin-type active region formed in the substrate, a step insulation layer, and a first high-level isolation layer. The fin-type active region protrudes from the substrate and extends in a first direction that is parallel to a main surface of the substrate. The fin-type active region includes a channel region having a first conductivity type. The fin-type active region includes a stepped portion on at least one sidewall thereof. The step insulation layer is on the at least one sidewall of the fin-type active region. The step insulation layer contacts the stepped portion of the fin-type active region. The first high-level isolation layer is on the at least one sidewall of the fin-type active region with the step insulation layer between the first high-level isolation layer and the at least one sidewall of the fin-type active region. The first high-level isolation layer extends in a second direction that is different from the first direction.

In example embodiments, a top surface of the step insulation layer may be at a level that is equal to or higher than a top surface of the fin-type active region.

In example embodiments, a top surface of the first high-level isolation layer may be at a level that is higher than or equal to a top surface of the fin-type active region.

In example embodiments, the IC device may further include a first low-level isolation layer on a lower sidewall of the fin-type active region. The first low-level isolation layer may extend in the first direction. A top surface of the first low-level isolation layer may be at a level that is lower than a top surface of the fin-type active region.

In example embodiments, a top level of the first high-level isolation layer may be higher than a top level of the first low-level isolation layer.

In example embodiments, at least one of the step insulation layer and the first high-level isolation layer may include an oxide capable of applying a tensile stress to the fin-type active region.

In example embodiments, the step insulation layer may include an insulation layer on the at least one sidewall of the fin-type active region. The insulation liner may contact the stepped portion of the fin-type active region. The step insulation layer may include a gap-fill insulating layer between the insulation liner and the first high-level isolation layer.

In example embodiments, the IC device may further include a normal gate on the fin-type active regions and a first dummy gate on the first high-level isolation layer. The normal gate and the first dummy gate may each extend in the second direction. The second direction may be different the first direction.

In example embodiments, the first dummy gate may vertically overlap the step insulation layer.

In example embodiments, the first dummy gate may have a bottom surface at a higher level than a bottom surface of the fin-type active region.

In example embodiments, the IC device may further include a second dummy gate on the first high-level isolation layer. The second dummy gate may extend in the second direction. The second dummy gate may be spaced apart from the first dummy gate. The first dummy gate may be between the normal gate and the second dummy gate.

In example embodiments, the fin-type active region may include source and drain regions formed in the fin-type active region on both sides of the normal gate. Sidewalls of the step insulation layer may contact end portions of the source and drain regions.

In example embodiments, the source and drain regions may include facets. A height of each of the facets may gradually decrease in a direction far away from a portion of the fin-type active region under the normal gate.

In example embodiments, the source and drain regions may have top surfaces at a lower level than a top surface of the step insulation layer.

In example embodiments, the channel region may be an NMOS channel region.

In example embodiments, the fin-type active region may include two first sidewalls and two second sidewalls. The two first sidewalls may extend in the first direction. The two second sidewalls may extend in a second direction that is different than the first direction. The first sidewalls have may a first width. The second sidewalls may have a second width that is less than the first width. The stepped portion may be formed in at least one of the second sidewalls of the fin-type active region.

In example embodiments, the stepped portion may be formed in each of the two second sidewalls of the fin-type active region.

According to example embodiments of inventive concepts, an IC device includes a substrate including one pair of first fin-type active regions and one pair of second fin-type active regions, a first high-level isolation layer on the substrate between the first fin-type active regions, a step insulation on the substrate, and a second high-level isolation layer on the substrate between the second fin-type active regions. The first fin-type active regions have a first-conductivity-type channel region and are formed in a straight line in a first region of a substrate. The second fin-type active regions have a second-conductivity-type channel region. The second fin-type active regions are formed in a straight line in a second region of the substrate. At least one first fin-type active region of the one pair of first fin-type active regions includes a stepped portion on one sidewall thereof. The step insulation layer is between the at least one first fin-type active region and the first high-level isolation layer. The step insulation layer contacts the stepped portion.

In example embodiments, a top surface of the first high-level isolation layer may be at a higher level than a top surface of the second high-level isolation layer.

In example embodiments, the IC device may further include at least one first normal gate on the one pair of first fin-type active regions and extending in a direction that intersects an extension direction of the one pair of first fin-type active regions, at least one first dummy gate on at least a portion of the first high-level isolation layer and extending in a direction parallel to the at least one first normal gate, at least one second normal gate on the one pair of second fin-type active regions and extending in a direction that intersect an extension direction of the one pair of second fin-type active regions, and at least one second dummy gate on at least a portion of the second high-level isolation layer In example embodiments, a bottom surface of the at least one first dummy gate may be at a higher level than a bottom surface of the at least one second dummy gate.

In example embodiments, at least a portion of a bottom surface of the at least one first dummy gate may vertically overlap the step insulation layer.

In example embodiments, a portion of a bottom surface of the at least one second dummy gate may be on a sidewalls of at least one second fin-type active region of the one pair of second fin-type active regions.

According to example embodiments of inventive concepts, a method of manufacturing an IC device includes forming one pair of first fin-type active regions in a first region of a substrate and forming one pair of second fin-type active regions in a second region of the substrate, forming a step insulation layer on at least one sidewall of the one pair of first fin-type active region, forming a first high-level isolation layer between the one pair of first fin-type active regions, and forming a second high-level isolation layer between the second fin-type active regions. Each of the first fin-type active regions includes the stepped portion disposed on at least one sidewall thereof. The step insulation layer contacts the stepped portion of each of the first fin-type active regions.

In example embodiments, the method may further include forming a sacrificial insulating layer on the first high-level isolation layer and the step insulation layer, and exposing upper sidewalls of the one pair of first fin-type active regions by etch back the sacrificial insulating layer. The forming the first high-level isolation layer may include forming a first trench between the first fin-type active regions, and forming the first high-level isolation layer by filling the first trench with an insulating material. The first active regions may extend in a first direction parallel to a main surface of the substrate. The first trench may extend in a second direction that is different than the first direction. A top surface of the first high-level isolation layer may be at a level higher than or equal to top surfaces of the one pair of first fin-type active regions.

In example embodiments, the method may further include exposing upper sidewalls of the one pair of second fin-type active regions by etching back a partial upper portion of the second high-level isolation layer. The forming the second high-level isolation layer may include forming a second trench between the second fin-type active regions, and forming the second high-level isolation layer by filling the second trench with an insulating material. The second fin-type active regions may extend in the first direction.

In example embodiments, a top surface of the first high-level isolation layer may be at a higher level than a top surface of the second high-level isolation layer.

In example embodiments, the method may further include forming a first normal gate on the first region of the substrate, forming at least one first dummy gate on the first high-level isolation layer and the step insulation layer, forming a second normal gate on the second region of the substrate, and forming at least one second dummy gate on the second high-level isolation layer. The first normal gate may intersect at least one first fin-type active region of the one pair of first fin-type active regions. The first dummy gate may extend in a same direction as the first normal gate. The second normal gate may intersect at least one second fin-type active region of the one pair of second fin-type active regions. The second dummy gate may extend in a same direction as the second normal gate.

In example embodiments, the at least one first dummy gate may have a bottom surface at a higher level than a bottom surface of the at least one second dummy gate.

In example embodiments, the method may further include forming source and drain regions in portions of at least one first fin-type active region of the one pair of first fin-type active regions on both sides of the first normal gate. The source and drain regions may include facets. End portions of the source and drain regions may be surrounded by the step insulation layer.

In example embodiments, the forming the step insulation layer may include forming an insulation liner on the stepped portion of each of the first fin-type active regions, and forming a gap-fill insulating layer on the insulation liner to fill the stepped portion.

According to example embodiments of inventive concepts, an IC device includes a substrate including a plurality of first fin-type active regions formed in the substrate, the first fin-type active regions being defined by first and second trenches formed in the substrate, the first trenches and second trenches extending in first and second directions, respectively, that cross each other, the first fin-type active regions being elongated in the first direction, the first fin-type active regions each including a pair of first sidewalls opposite each other in the first direction and a pair of second sidewalls opposite each other in the second direction, at least one of the second sidewalls including a stepped portion, the first fin-type active regions each including a lower portion below the stepped portion and an upper portion that protrudes above the stepped portion; a first high-level isolation layer in the second trenches; and a step insulation layer on the stepped portion. The step insulation layer is between the first high-level isolation layer and the upper portions of the first fin-type active regions.

In example embodiments, the IC device may further include a gate structure extending in the second direction and crossing over the first fin-type active regions. The first fin-type active regions may include a NMOS channel between source and drain regions. The gate structure may cross over the NMOS channel. The gate structure may include a gate electrode on a gate insulating layer.

In example embodiments, the IC device may further include a dummy gate extending in the second direction. The dummy gate may cross over the stepped portions in the first fin-type active regions.

In example embodiments, each of the second sidewalls in the first fin-type active regions may include the stepped portion.

In example embodiments, the IC device may further include an insulation layer between the step insulation layer and the stepped portions and upper portions of the first fin-type active regions.

BRIEF DESCRIPTION OF THE DRAWINGS

The foregoing and other features of inventive concepts will be more clearly understood from the following detailed description of non-limiting embodiments, as illustrated in the accompanying drawings in which like reference characters refer to like parts throughout different views. The drawings are not necessarily to scale. Emphasis instead is placed upon illustrating principles of inventive concepts. In the drawings:

FIGS. 1B and 1C are cross-sectional views taken along lines 1B-1B' and 1C-1C' of FIG. 1A;

FIGS. 7B and 7C are cross-sectional views taken along lines 7B-7B' and 7C-7C' of FIG. 7A;

FIGS. 12A to 12G and 13A to 13G are cross-sectional views for explaining a method of manufacturing an IC device according to example embodiments;

DETAILED DESCRIPTION OF EXAMPLE EMBODIMENTS

Figure 1A:
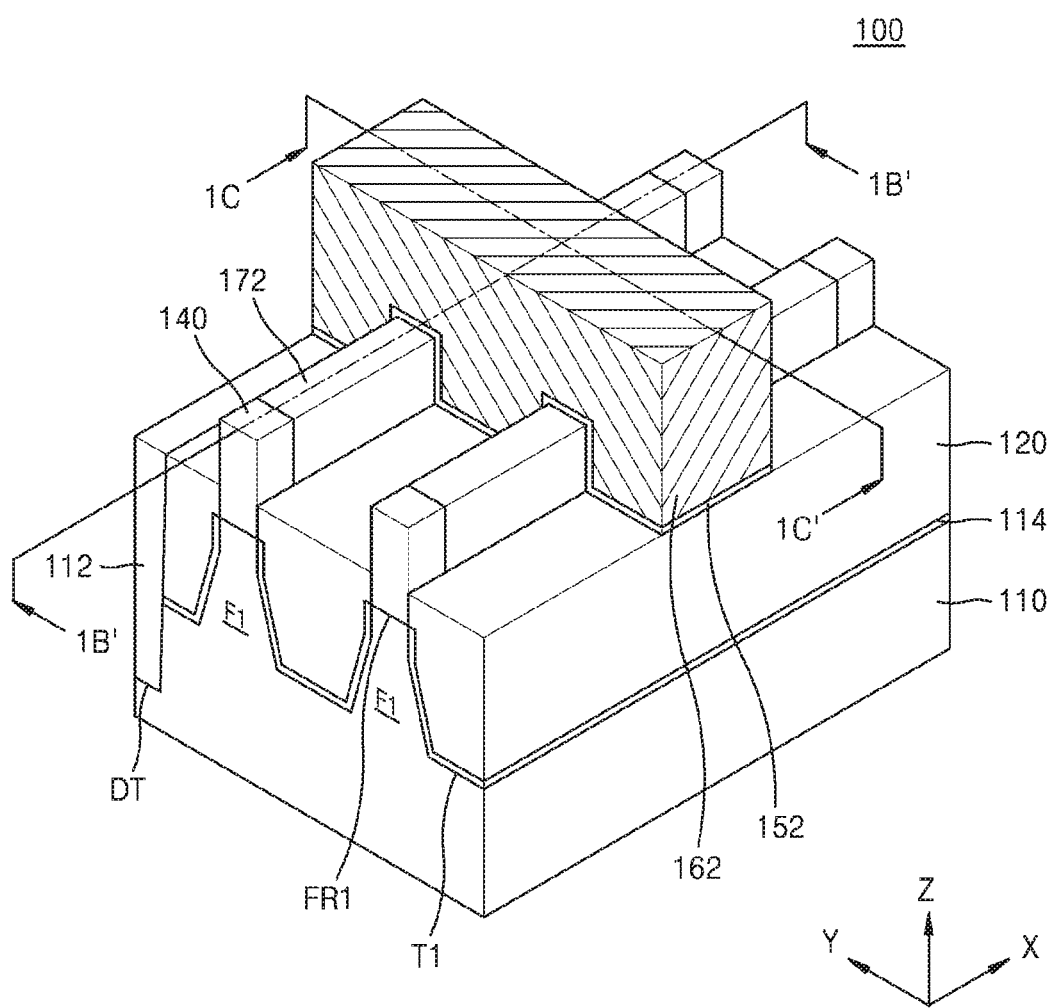
FIG. 1A is a perspective view of an IC device according to example embodiments.

Example embodiments will now be described more fully with reference to the accompanying drawings, in which some example embodiments are shown. Example embodiments, may, however, be embodied in many different forms and should not be construed as being limited to the embodiments set forth herein; rather, these example embodiments are provided so that this disclosure will be thorough and complete, and will fully convey the scope of example embodiments of inventive concepts to those of ordinary skill in the art. In the drawings, the thicknesses of layers and regions are exaggerated for clarity. Like reference characters and/or numerals in the drawings denote like elements, and thus their description may not be repeated. As used herein, the term "and/or" includes any and all combinations of one or more of the associated listed items. Expressions such as "at least one of," when preceding a list of elements, modify the entire list of elements and do not modify the individual elements of the list.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Other words used to describe the relationship between elements or layers should be interpreted in a like fashion (e.g., "between" versus "directly between," "adjacent" versus "directly adjacent," "on" versus "directly on").

Meanwhile, spatially relative terms, such as "between" and "directly between" or "adjacent to" and "directly adjacent to" and the like, which are used herein for ease of description to describe one element or feature's relationship to another element(s) or feature(s) as illustrated in the figures, should be interpreted similarly. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments of inventive concepts.

As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof. Expressions such as "at least one of," when preceding a list of elements, modify the entire list of elements and do not modify the individual elements of the list.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an etched region or an implanted region illustrated as a rectangle may have rounded or curved features. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which this inventive concept belongs. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIG. 1A is a perspective view of an IC device according to example embodiments. FIGS. 1B and 1C are cross-sectional views taken along lines 1B-1B' and 1C-1C' of FIG. 1A.

Referring to FIGS. 1A to 1C, the IC device 100 may include a substrate in which a fin-type active region F1 is formed. In example embodiments, a substrate 110 may be a semiconductor substrate including a semiconductor material, such as silicon, germanium, silicon germanium, silicon carbide, gallium arsenide, indium arsenide, and indium phosphide. Alternatively, the substrate 110 may have a semiconductor-on-insulator (SOI) structure (e.g., silicon on insulator). For example, substrate 110 may include a buried oxide (BOX) layer. The substrate 110 may include a conductive region (e.g., a doped well) or a doped structure.

A deep trench DT having a desired (and/or alternatively predetermined) depth from a top surface of the fin-type active region F1 may be formed in the substrate 110, and a field insulating layer 112 may be formed to fill the deep trench DT.

The fin-type active region F1 may protrude from the substrate 110 in a Z direction perpendicular to a main surface of the substrate 110 and have a first-conductivity-type channel region CH1. In example embodiments, the first-conductivity-type channel region CH1 may be an NMOS channel region, but inventive concepts are not limited thereto.

The fin-type active region F1 may extend in an X direction parallel to the main surface of the substrate 110. For example, the fin-type active region F1 may have a long side in an X direction, which is an extension direction, and a short side in a Y direction perpendicular to the X direction. That is, the fin-type active region F1 may have a pair of first sidewalls FW1, which extends in the X direction, and a pair of second sidewalls FW2, which extends in the Y direction. A width of the one pair of first sidewall FW1 may be greater than a width of the one pair of second sidewalls FW2.

The fin-type active region F1 may be defined by a first trench T1 extending in the X direction and a second trench T2 extending in the Y direction. The pair of first sidewalls FW1 of the fin-type active region F1 may be exposed by the first trench T1, and the pair of second sidewalls FW2 of the fin-type active region F1 may be exposed by the second trench T2. A bottom level LV2 of the first trench T1 may be the same as a bottom level LV3 of the second trench T2. However, the bottom level LV2 of the first trench T1 may be higher than the bottom level LV3 of the second trench T2. Also, the bottom level LV2 of the first trench T1 and the bottom level LV3 of the second trench T2 may be higher than a bottom level LV1 of the deep trench DT.

A stepped portion FR1 may be formed on at least one second sidewall FW2 of the one pair of second sidewalls FW2 of the fin-type active region F1. A bottom level LV4 of the stepped portion FR1 may be higher than the bottom level LV3 of the second trench T2.

In example embodiments, the stepped portion FR1 may include a sidewall portion and a bottom portion, and the sidewall portion of the stepped portion FR1 may be inclined at a desired (and/or alternatively predetermined) inclination from the top surface of the fin-type active region F1. In example embodiments, the sidewall portion of the stepped portion FR1 may be inclined at an inclination of about 60° to about 90° with respect to the main surface of the substrate 110. The sidewall portion of the stepped portion FR1 may be substantially perpendicular to the top surface of the fin-type active region F1 or inclined at a similar inclination to the at least one second sidewall FW2 of the one pair of second sidewalls FW2. However, an inclination of the sidewall portion of the stepped portion FR1 is not limited thereto.

In example embodiments, the bottom portion of the stepped portion FR1 may be inclined at a desired (and/or alternatively predetermined) inclination from a lowermost end of the sidewall portion of the stepped portion FR1. In example embodiments, the bottom portion of the stepped portion FR1 may be inclined at an inclination of about 0° to about 30° with respect to the main surface of the substrate 110. For example, the bottom portion of the stepped portion FR1 may be substantially parallel to the main surface of the substrate 110. However, an inclination of the bottom portion of the stepped portion FR1 is not limited thereto.

A low-level isolation layer 120 may be formed on the one pair of first sidewalls FW1 of the fin-type active region F1. The low-level isolation layer 120 may fill the first trench T1 extending in the X direction, and extend in the X direction. A top level LV_I of the low-level isolation layer 120 may be lower than a top level LV_F of the fin-type active region F1. Thus, the low-level isolation layer 120 may be disposed on lower sides of the one pair of first sidewalls FW1 of the fin-type active region F1, and upper sides of the one pair of first sidewalls FW1 of the fin-type active region F1 may protrude at a higher level than a top surface of the low-level isolation layer 120.

A high-level isolation layer 130 may be formed on the one pair of second sidewalls FW2 of the fin-type active region F1. The high-level isolation layer 130 may fill the second trench T2 extending in the Y direction, and extend in the Y direction. A top surface of the high-level isolation layer 130 may be at substantially the same level as the top level LV_F of the fin-type active region F1. In another case, the top surface of the high-level isolation layer 130 may be at a higher level than the top level LV_F of the fin-type active region F1.

In example embodiments, the low-level isolation layer 120 and the high-level isolation layer 130 may include an oxide layer formed using a flowable chemical vapor deposition (FCVD) process or a spin coating process. For example, the low-level isolation layer 120 and the high-level isolation layer 130 may include fluoride silicate glass (FSG), undoped silicate glass (USG), boro-phospho-silicate glass (BPSG), phospho-silicate glass (PSG), flowable oxide (FOX), plasma-enhanced tetra-ethyl-ortho-silicate (PE-TEOS), or tonen silazene (TOSZ), but materials of the low-level isolation layer 120 and the high-level isolation layer 130 are not limited thereto.

Optionally, a liner 114 may be further formed between the fin-type active region F1 and the low-level isolation layer 120 and between the fin-type active region F1 and the high-level isolation layer 130. In example embodiments, the liner 114 may be conformally formed on sidewalls and bottom portions of the first and second trenches T1 and T2. For example, the liner 114 may have a thickness of about 10 Å to about 100 Å, but a thickness of the liner 114 is not limited thereto. In example embodiments, the liner 114 may include an oxide layer formed by using a process of oxidizing a surface of the fin-type active region F1 exposed by the first and second trenches T1 and T2. The oxidation process may be, for example, an in-situ steam generation (ISSG) process, a thermal oxidation process, an ultraviolet (UV) oxidation process, or an oxygen (e.g., $O_2$) plasma oxidation process.

A step insulation layer 140, which may be in contact with the stepped portion FR1, may be formed between the at least one second sidewall FW2 of the one pair of second sidewalls FW2 of the fin-type active region F1 and the high-level isolation layer 130. The step insulation layer 140 may be formed to be in contact with the sidewall portion and the bottom portion of the stepped portion FR1. Thus, a bottom surface of the step insulation layer 140 may be at substantially the same level as the bottom level LV4 of the stepped portion FR1.

In example embodiments, the step insulation layer 140 may include an oxide layer formed by using an FCVD process or a spin coating process. For example, the step insulation layer 140 may include FSG, USG, BPSG, PSG, FOX, PE-TEOS, or TOSZ, but a material of the step insulation layer 140 is not limited thereto. The step insulation layer 140 may be formed of the same material as the high-level isolation layer 130. In another case, the step insulation layer 140 may include a different material from the high-level isolation layer 130.

In example embodiments, a width of the step insulation layer 140 in the X direction (e.g., the width of the step insulation layer 140 in an extension direction of the fin-type active region F1) may range from about 5 nm to about 50 nm, but the width of the step insulation layer 140 in the X direction is not limited thereto. The width of the step insulation layer 140 in the X direction may be appropriately selected in consideration of a width of the fin-type active region F1 in the X direction and a difference in coefficient of thermal expansion (or coefficient of thermal contraction) among the fin-type active region F1, the step insulation layer 140, and/or the high-level isolation layer 130. Also, a width of the step insulation layer 140 in the Y direction may be substantially equal to a width of the fin-type active region F1 in the Y direction, but the width of the step insulation layer 140 in the Y direction is not limited thereto.

In example embodiments, a top level LV5 of the step insulation layer 140 may be substantially at the same height or a higher height than the top level LV_F of the fin-type active region F1. Also, a top surface of the high-level isolation layer 130 may be at substantially the same level as the top level LV5 of the step insulation layer 140.

Since the stepped portion FR1 is formed in at least one second sidewall FW2 of the one pair of second sidewalls FW2 of the fin-type active region F1, a surface area of the at least one second sidewall FW2 of the one pair of second sidewalls FW2 of the fin-type active region F1 may be increased more than when the stepped portion FR1 is not formed. Also, since the step insulation layer 140 is formed in the stepped portion FR1 to be in contact with the stepped portion FR1, a contact area between the fin-type active region F1 and the step insulation layer 140 and a contact area between the fin-type active region F1 and the high-level isolation layer 130 may be increased more than when the step insulation layer 140 is not formed. Accordingly, stress applied to the fin-type active region F1 may be increased by the step insulation layer 140 and the high-level isolation layer 130, which may be advantageous to improving performance of an NMOS transistor.

Meanwhile, the liner 114 may not be formed on the stepped portion FR1 of the fin-type active region F1. Accordingly, the step insulation layer 140 may be interposed between an upper side of the high-level isolation layer 130 and the at least one second sidewall FW2 of the one pair of second sidewalls FW2 of the fin-type active region F1, and the liner 114 may be interposed between a lower side of the high-level isolation layer 130 and the at least one second sidewall FW2 of the one pair of second sidewalls FW2 of the fin-type active region F1.

A gate insulating layer 152 and a gate electrode 162 may be formed on the fin-type active region F1 and the low-level isolation layer 120 to cover one pair of first sidewalls FW1 and a top surface of the fin-type active region F1. The gate insulating layer 152 and the gate electrode 162 may extend in a direction (e.g., the Y direction), which may intersect the extension direction of the fin-type active region F1.

Although FIG. 1A illustrates an example in which the gate insulating layer 152 is in contact with a bottom surface of the gate electrode 162, inventive concepts are not limited thereto. For example, the gate insulating layer 152 may be formed to contact the bottom surface and both sidewalls of the gate electrode 162.

In example embodiments, the gate insulating layer 152 may be formed of a silicon oxide layer, a high-k dielectric layer, or a combination thereof. The high-k dielectric layer may be formed of a material having a higher dielectric constant than a silicon oxide layer. For example, the gate insulating layer 152 may have a dielectric constant of about 10 to about 25. The high-k dielectric layer may be formed of a material selected from the group consisting of hafnium oxide, hafnium oxynitride, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, lead zinc niobate, and a combination thereof, but materials forming the high-k dielectric layer are not limited thereto. In example embodiments, the gate insulating layer 152 may be formed by using an atomic layer deposition (ALD) process, a chemical vapor deposition (CVD) process, or a physical vapor deposition (PVD) process.

The gate electrode 162 may include a metal-containing layer for controlling a work function and a gap-filling metal-containing layer configured to fill a space formed in an upper portion of the metal-containing layer for controlling the work function. In example embodiments, the gate electrode 162 may have a multilayered structure in which a metal nitride layer, a metal layer, a conductive capping layer, and a gap-fill metal layer are sequentially stacked. Each of the metal nitride layer and the metal layer may include at least one metal selected from the group consisting of titanium (Ti), tungsten (W), ruthenium (Ru), niobium (Nb), molybdenum (Mo), hafnium (Hf), nickel (Ni), cobalt (Co), platinum (Pt), ytterbium (Yb), terbium (Tb), dysprosium (Dy), erbium (Er), and palladium (Pd). Each of the metal nitride layer and the metal layer may be formed by using an ALD process, a metal organic ALD (MOALD), or a metal organic CVD (MOCVD) process. The conductive capping layer may serve as a protection layer for limiting (and/or preventing) oxidation of a surface of the metal layer. Also, when another conductive layer is deposited on the metal layer, the conductive capping layer may serve as a wetting layer for facilitating the deposition of the another conductive layer. The conductive capping layer may be formed of a metal nitride, for example, TiN, TaN, or a combination thereof, but inventive concepts are not limited thereto. The gap-fill metal layer may extend on the conductive capping layer. The gap-fill metal layer may include a tungsten (W) layer. The gap-fill metal layer may be formed by using an ALD process, a CVD process, or a PVD process. The gap-fill metal layer may fill a recess space formed by a stepped portion of a top surface of the conductive capping layer without forming voids.

Source and drain regions 172 may be formed in an upper portion of the fin-type active region F1 on both sides of the gate electrode 162. Although not shown, the source and drain regions 172 may include a semiconductor layer that is epitaxially grown from the fin-type active region F1. The source and drain regions 172 may include an embedded silicon-germanium (SiGe) structure including a plurality of epitaxially grown SiGe layers, an epitaxially grown Si layer, or an epitaxially grown silicon-carbide (SiC) layer.

The IC device 100 described with reference to FIGS. 1A to 1C may include the fin-type active region F1 having one sidewall on which the stepped portion FR1 is formed, the step insulation layer 140 being in contact with the stepped portion FR1, and the high-level isolation layer 130 disposed on the one sidewall of the fin-type active region F1 with the step insulation layer 140 therebetween. A contact area between the fin-type active region F1 and the step insulation layer 140 and a contact area between the fin-type active region F1 and the high-level isolation layer 130 may increase due to the stepped portion FR1. Accordingly, after the high-level isolation layer 130 and the step insulation layer 140 are formed, when the high-level isolation layer 130 and the step insulation layer 140 are annealed during subsequent various processes, a high stress may be applied to the fin-type active region F1 due to tensile strain caused by shrinkage of the high-level isolation layer 130 and the step insulation layer 140.

Also, since the high-level isolation layer 130 and the step insulation layer 140 are disposed at a higher level than the top surface of the fin-type active region F1 or at substantially the same level as the top surface of the fin-type active region F1, the amount of insulating material contained in the high-level isolation layer 130 and the step insulation layer 140 may increase. Accordingly, tensile strain caused by the shrinkage of the high-level isolation layer 130 and the step insulation layer 140 may increase, and a higher stress may be applied to the fin-type active region F1. Accordingly, when the IC device 100 is an NMOS transistor, performance of the IC device 100 may be improved.

Figure 2A:
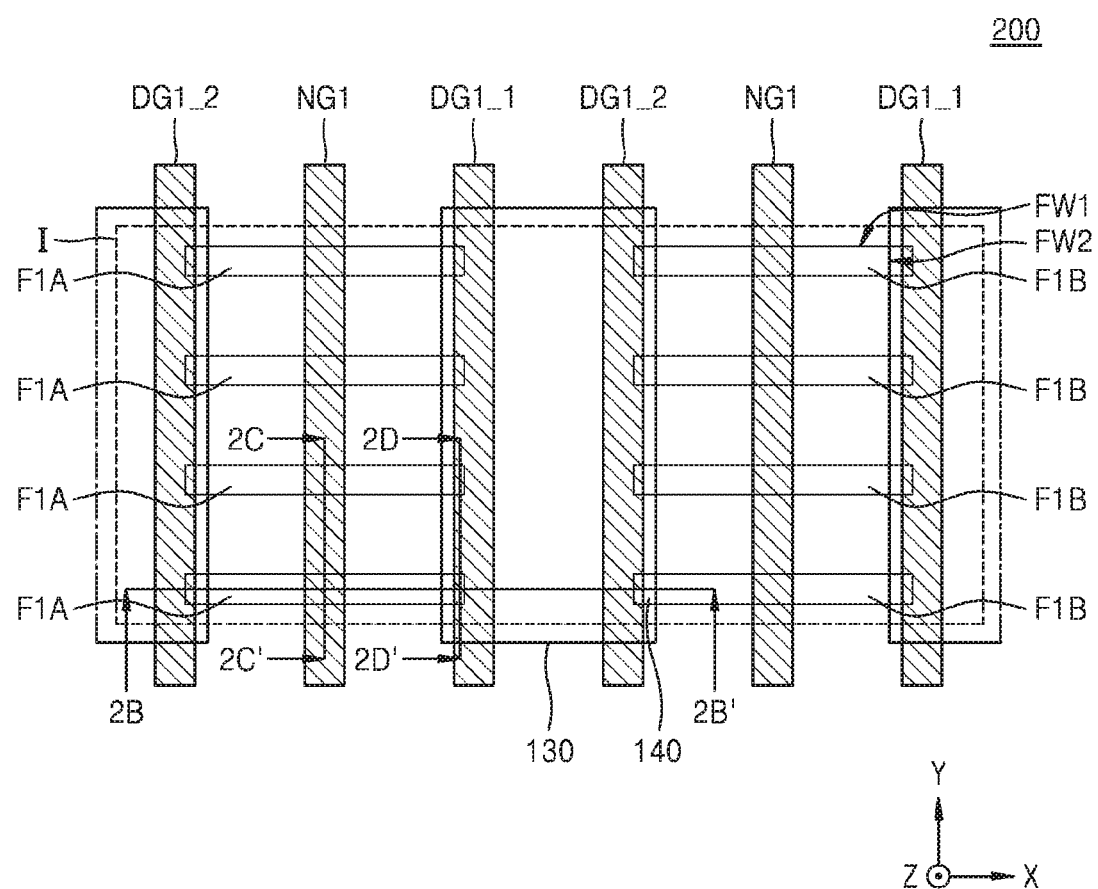
FIG. 2A is a plan layout diagram of an IC device according to example embodiments.
Figure 2B:
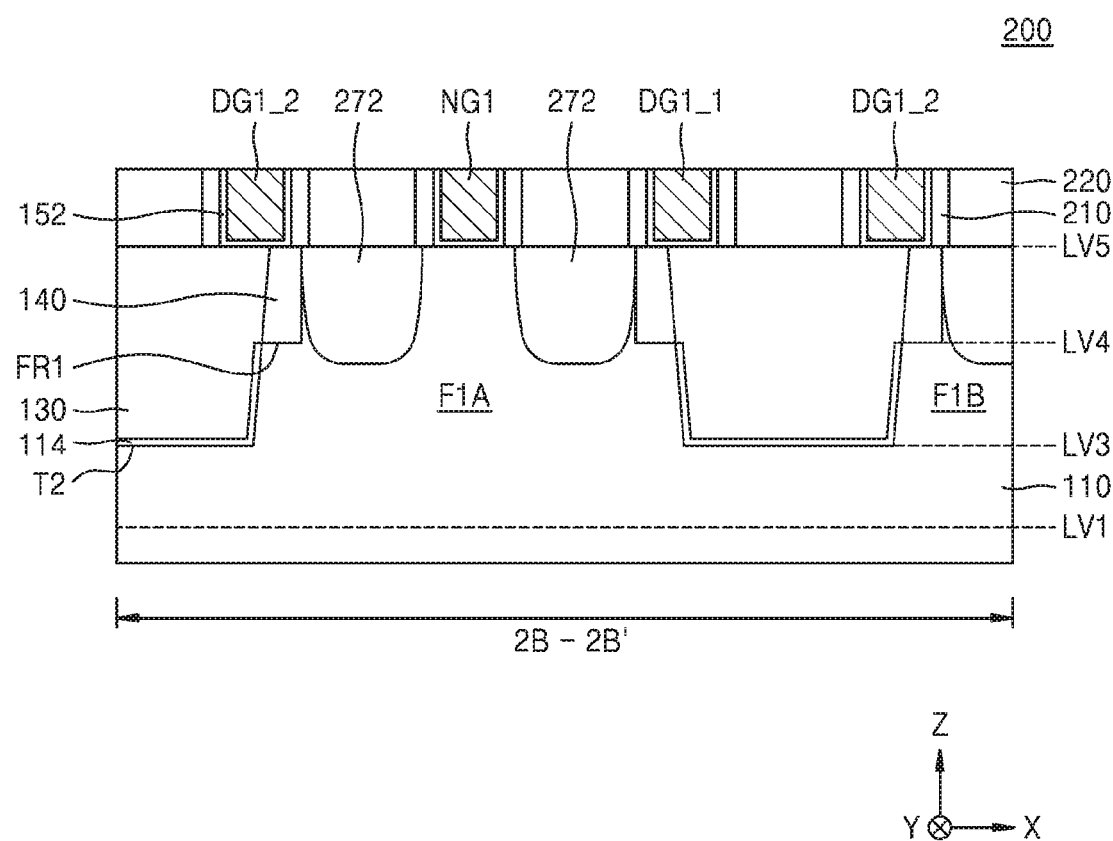
FIG. 2B is a cross-sectional view taken along a line 2B-2B' of FIG. 2A.
Figures 2C, 2D:
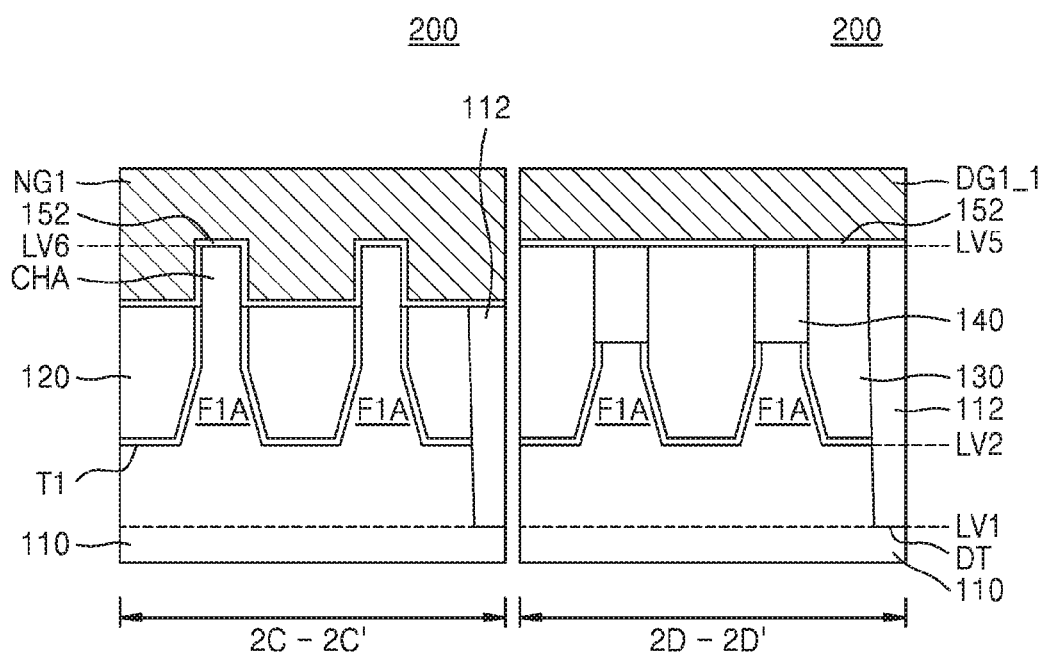
FIGS. 2C and 2D are cross-sectional views taken along lines 2C-2C' and 2D-2D' of FIG. 2A.

FIG. 2A is a plan layout diagram of an IC device according to example embodiments. FIG. 2B is a cross-sectional view taken along a line 2B-2B' of FIG. 2A. FIGS. 2C and 2D are cross-sectional views taken along lines 2C-2C' and 2D-2D' of FIG. 2A. In FIGS. 2A to 2D, the same elements as in FIGS. 1A to 1C are denoted by the same reference numerals, and detailed descriptions thereof are omitted.

Referring to FIGS. 2A to 2D, a pair of fin-type active regions F1A and F1B may protrude from a first region I of a substrate 110 in a direction (e.g., Z direction of FIG. 2A) that is perpendicular to a main surface of the substrate 110. Each of the one pair of fin-type active regions F1A and F1B may have a first-conductivity-type channel region CHA. For example, the first-conductivity-type channel region CHA may be an NMOS channel region, but inventive concepts are not limited thereto.

A deep trench DT may be formed in the substrate 110 to a desired (and/or alternatively predetermined) depth from top surfaces of the one pair of fin-type active regions F1A and F1B, and a field insulating layer 112 may be formed to fill the deep trench DT. The first region I of the substrate 110 may be defined by the field insulating layer 112. The field insulating layer 112 may be formed in an edge portion of the first region I of the substrate 110. Alternatively, although not shown in FIGS. 2A to 2D, the field insulating layer 112 may be formed in a connection region between a plurality of first regions I.

Each of the one pair of fin-type active regions F1A and F1B may extend in one direction (e.g., X direction of FIG. 2A) that is parallel to the main surface of the substrate 110. The one pair of fin-type active regions F1A and F1B may be arranged in a straight line along the extension direction (X direction) of the one pair of fin-type active regions F1A and F1B, and a plurality of pairs of fin-type active regions F1A and F1B may be disposed apart from one another in a Y direction different from the X direction. That is, FIG. 2A illustrates an example in which four pairs of fin-type active regions F1A and F1B are formed in the first region I of the substrate 110, but the number of pairs of fin-type active regions F1A and F1B are not limited thereto.

One pair of normal gates NG1 may be disposed on the one pair of fin-type active regions F1A and F1B and extend in a direction (Y direction) that may intersect the extension direction of the one pair of fin-type active regions F1A and F1B. First and second dummy gates DG1_1 and DG1_2 may be disposed between one pair of normal gates NG1 and extend in a direction (Y direction) that is substantially parallel to one pair of normal gates NG1. The first and second dummy gates DG1_1 and DG1_2 may vertically overlap a high-level isolation layer 130, which may extend in the Y direction between one pair of fin-type active regions F1A and F1B.

FIG. 2A illustrates a case in which one of the one pair of fin-type active regions F1A and F1B intersects one of the one pair of normal gates NG1, and the first dummy gate DG1_1 and the second dummy gate DG1_2 are formed on both sides of at least one of the one pair of normal gates NG1. However, inventive concepts are not limited thereto. Unlike shown in FIG. 2A, a plurality of normal gates NG1 may be arranged in one row and intersect one of the one pair of fin-type active regions F1A and F1B, and the first dummy gate DG1_1 and the second dummy gate DG1_2 may be formed on both sides of the plurality of normal gates NG1 with the plurality of normal gates NG1 therebetween.

Each of the one pair of fin-type active regions F1A and F1B may have a long side in the extension direction of the one pair of fin-type active regions F1A and F1B, and have a short side in a direction that may intersect the extension direction. For example, the one pair of fin-type active regions F1A and F1B may have one pair of first sidewalls FW1, which may extend in the X direction, and one pair of second sidewalls FW2, which may extend in the Y direction, and the one pair of first sidewalls FW1 may have a greater width than the one pair of second sidewalls FW2.

A first trench T1 and a second trench T2 may be formed in both sides of the one pair of fin-type active regions F1A and F1B. The first trench T1 may extend in the extension direction (X direction) of the one pair of fin-type active regions F1A and F1B. A second trench T2 may be formed between the one pair of fin-type active regions F1A and F1B and extend in the direction (Y direction) that may intersect the extension direction. Accordingly, one pair of first sidewalls FW1 of the one pair of fin-type active regions F1A and F1B may be exposed by the first trench T1, and one pair of second sidewalls FW2 of the one pair of fin-type active regions F1A and F1B may be exposed by the second trench T2. A bottom level LV2 of the first trench T1 may be substantially equal to a bottom level LV3 of the second trench T2. However, the bottom level LV2 of the first trench T1 may be higher than the bottom level LV3 of the second trench T2. Also, the bottom level LV2 of the first trench T1 and the bottom level LV3 of the second trench T2 may be higher than a bottom level LV1 of the deep trench DT.

A stepped portion FR1 may be formed on at least one of the one pair of second sidewalls FW2 of the one pair of fin-type active regions F1A and F1B. A bottom level LV4 of the stepped portion FR1 may be higher than a bottom level LV3 of the second trench T2. In example embodiments, the stepped portion FR1 may include a sidewall portion and a bottom portion, and the sidewall portion of the stepped portion FR1 may be inclined at a desired (and/or alternatively predetermined) inclination from the top surfaces of the one pair of fin-type active regions F1A and F1B.

A low-level isolation layer 120 may be formed on lower sides of the one pair of first sidewalls FW1 of the one pair of fin-type active regions F1A and F1B. The low-level isolation layer 120 may fill the first trench T1, which may extend in the X direction, to a desired (and/or alternatively predetermined) height and extend in the X direction. Upper sides of the one pair of first sidewalls FW1 of the one pair of fin-type active regions F1A and F1B may protrude over a top surface of the low-level isolation layer 120, and the top surface of the low-level isolation layer 120 may be disposed at a lower level than the top surfaces of the fin-type active regions F1A and F1B.

The high-level isolation layer 130 may extend in a direction (Y direction), which may intersect the one pair of fin-type active regions F1A and F1B between the one pair of fin-type active regions F1A and F1B. The high-level isolation layer 130 may be formed to fill the inside of the second trench T2, which may extend in a direction (Y direction) parallel to the one pair of normal gates NG1 and the first and second dummy gates DG1_1 and DG1_2, between the one pair of fin-type active regions F1A and F1B. As shown in FIG. 2B, a top surface of the high-level isolation layer 130 may be disposed at substantially the same level as the top surfaces of the one pair of fin-type active regions F1A and F1B. Alternatively, the top surface of the high-level isolation layer 130 may be disposed at a higher level than the top surfaces of the one pair of fin-type active regions F1A and F1B.

As shown in FIGS. 2B to 2D, the high-level isolation layer 130 may be disposed at a higher level than the top surface of the low-level isolation layer 120 so that the amount of insulating material contained in the high-level isolation layer 130 may be relatively large. Accordingly, after the high-level isolation layer 130 is formed, when the high-level isolation layer 130 is annealed during subsequent various processes, relatively high tensile strain may be applied to the one pair of fin-type active regions F1A and F1B due to the shrinkage of the high-level isolation layer 130.

As shown in FIG. 2B, first and second dummy gates DG1_1 and DG1_2 may be disposed apart from each other on the high-level isolation layer 130. Accordingly, a width of the high-level isolation layer 130 in the X direction may be larger than a distance between the first and second dummy gates DG1_1 and DG1_2. Since the high-level isolation layer 130 having a relatively large width is disposed between the one pair of fin-type active regions F1A and F1B, a relatively large amount of insulating material may be contained in the high-level isolation layer 130. Accordingly, after the high-level isolation layer 130 is formed, when the high-level isolation layer 130 is annealed during subsequent various processes, relatively high tensile strain may be applied to the one pair of fin-type active regions F1A and F1B due to the shrinkage of the high-level isolation layer 130.

Optionally, a liner 114 may be further formed between the one pair of fin-type active regions F1A and F1B and the low-level isolation layer 120 and between the one pair of fin-type active regions F1A and F1B and the high-level isolation layer 130.

A step insulation layer 140, which is in contact with the stepped portion FR1, may be formed between at least one second sidewall FW2 of a pair of second sidewalls FW2 of each of the one pair of fin-type active regions F1A and F1B and the high-level isolation layer 130. The step insulation layer 140 may be formed to be in contact with the sidewall portion and the bottom portion of the stepped portion FR1. The at least one second sidewall FW2 of the one pair of second sidewalls FW2 may have a larger surface area than when the stepped portion FR1 is not formed. Accordingly, a contact area between the at least one of the second sidewalls FW2 and the high-level isolation layer 130 and a contact area between the at least one of the second sidewalls FW2 and the step insulation layer 140 may increase more than when the step insulation layer 140 is not formed (e.g., than a contact area between the at least one of the second sidewalls FW2 and the high-level isolation layer 130). Accordingly, after the high-level isolation layer 130 and the step insulation layer 140 are formed, when the high-level isolation layer 130 and the step insulation layer 140 are annealed during subsequent various processes, high stress may be applied to the one pair of fin-type active regions F1A and F1B by tensile strain caused by the shrinkage of the high-level isolation layer 130 and the step insulation layer 140.

As shown in FIG. 2A, the step insulation layer 140 may be disposed on each of the one pair of second sidewalls FW2 of each of the one pair of fin-type active regions F1A and F1B, and vertically overlap portions of the first and second dummy gate DG1_1 and DG1_2, but inventive concepts are not limited thereto.

Meanwhile, a top level LV5 of the step insulation layer 140 may be disposed at substantially the same level as the top surfaces of the one pair of fin-type active regions F1A and F1B as shown in FIG. 2B or disposed at a higher level than the top surfaces of the one pair of fin-type active regions F1A and F1B. A case in which a top surface of the step insulation layer 140 is disposed at a higher level than the top surfaces of the one pair of fin-type active regions F1A and F1B will be described in detail later with reference to FIG. 6.

The one pair of normal gates NG1 and the first and second dummy gates DG1_1 and DG1_2 may have generally similar configurations to the gate electrode 162 described with reference to FIGS. 1A to 1C.

As shown in FIG. 2B, since the top surfaces of the high-level isolation layer 130 and the step insulation layer 140 are disposed at substantially the same level as the top surfaces of the one pair of fin-type active regions F1A and F1B, the first and second dummy gates DG1_1 and DG1_2 may have bottom surfaces disposed at substantially the same level as bottom surfaces of the one pair of normal gates NG1. Accordingly, the first and second dummy gates DG1_1 and DG1_2 may not be disposed between the one pair of fin-type active regions F1A and F1B. Accordingly, as compared with a case in which a top level of the high-level isolation layer 130 is lower than top levels of the one pair of fin-type active regions F1A and F1B, parasitic capacitances formed between the first and second dummy gates DG1_1 and DG1_2 and the one pair of fin-type active regions F1A and F1B may be greatly reduced. Also, since distances between the first and second dummy gates DG1_1 and DG1_2 and the one pair of fin-type active regions F1A and F1B are ensured, a leakage current may be reduced and/or inhibited.

Both sidewalls of each of the one pair of normal gates NG1 and the first and second dummy gates DG1_1 and DG1_2 may be covered with insulating spacers 210 and an inter-gate dielectric layer 220. In example embodiments, the insulating spacers 210 may be formed of a silicon nitride (Si$_3$N$_4$) layer, a silicon oxynitride (SiON) layer, a carbon (C)-containing silicon oxynitride (SiCON) layer, or a combination thereof. The inter-gate dielectric layer 220 may include a tetra ethyl ortho silicate (TEOS) layer or an ultralow k (ULK) layer having an ultralow dielectric constant k of about 2.2 to about 2.4, for example, any one selected from a SiOC layer and a SiCOH layer.

In example embodiments, the one pair of normal gates NG1 and the first and second dummy gates DG1_1 and DG1_2 may be formed by using a gate-last process (or referred to as a replacement poly-gate (RPG) process), but inventive concepts are not limited thereto.

A gate insulating layer 152 may be between the one pair of normal gates NG1 and the one pair of fin-type active regions F1A and F1B. Also, the gate insulating layer 152 may be between each of the first and second dummy gates DG1_1 and DG1_2 and the step insulation layer 140 and the high-level isolation layer 130.

Source and drain regions 272 may be formed on both sides of the one pair of normal gates NG1 of the one pair of fin-type active regions F1A and F1B. Portions of the source and drain regions 272 disposed adjacent to both sides of the high-level isolation layer 130, from among the source and drain regions 272 formed in the one pair of fin-type active regions F1A and F1B, may vertically overlap the insulating spacers 210 and have tuck shapes that are pushed into portions disposed under the insulating spacers 210.

In the IC device 200 described with reference to FIGS. 2A to 2D, a contact area between the one pair of fin-type active regions F1A and F1B and the step insulation layer 140 and a contact area between the one pair of fin-type active regions F1A and F1B and the high-level isolation layer 130 may increase due to the stepped portion FR1. Also, since the high-level isolation layer 130 and the step insulation layer 140 are disposed at a higher level than or substantially the same level as the top surfaces of the one pair of fin-type active regions F1A and F1B, the amount of insulating material included in the high-level isolation layer 130 and the step insulation layer 140 may increase. Also, since the first and second dummy gates DG1_1 and DG1_2 are disposed apart from one another on the high-level isolation layer 130 having a relatively great width, the amount of the insulating material included in the high-level isolation layer 130 may increase. Accordingly, tensile strain caused by the shrinkage of the high-level isolation layer 130 and the step insulation layer 140 may increase, and higher stress may be applied to the one pair of fin-type active regions F1A and F1B. As a result, when the IC device 200 is an NMOS transistor, performance of the IC device 200 may be improved.

Figure 3:
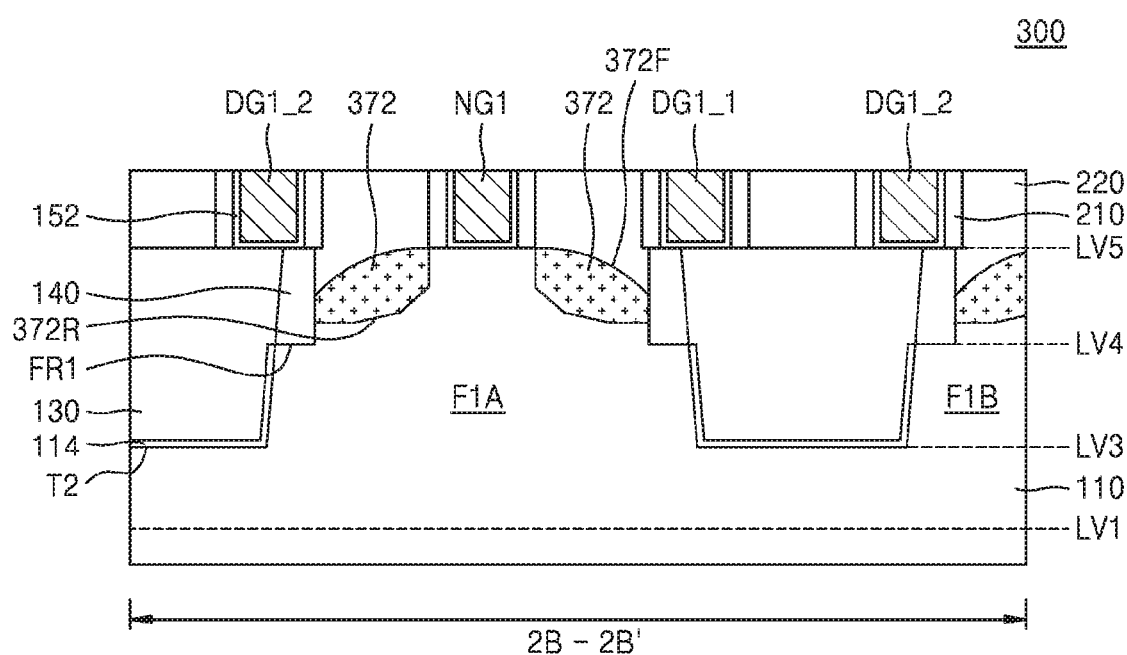
FIG. 3 is a partial cross-sectional view of an IC device according to example embodiments.

FIG. 3 is a partial cross-sectional view of an IC device 300 according to example embodiments, which may have the same plan layout as shown in FIG. 2A. Specifically, FIG. 3 is a cross-sectional view of a portion corresponding to the cross-sectional view taken along the line 2B-2B' of FIG. 2A. In FIG. 3, the same elements as in FIGS. 1A to 2D are denoted by the same reference numerals, and detailed descriptions thereof are omitted.

Referring to FIG. 3, the IC device 300 may have about the same configuration as the IC device 200 described with reference to FIGS. 2A to 2D. However, source and drain regions 372 having faceted source and drain structures may be formed on both sides of the one pair of fin-type active regions F1A and F1B.

The source and drain regions 372 may include facets 372F, which may be inclined at a desired (and/or alternatively predetermined) inclination from portions of the one pair of fin-type active regions F1A and F1B disposed under the one pair of normal gates NG1. As shown in FIG. 3, portions of the source and drain regions 372 adjacent to the portions of the one pair of fin-type active regions F1A and F1B disposed under the one pair of normal gates NG1 may have top surfaces disposed at substantially the same level as the top surfaces of the one pair of fin-type active regions F1A and F1B. A top level of the source and drain regions 372 may be gradually reduced far away from the portions of the one pair of fin-type active regions F1A and F1B disposed under the one pair of normal gates NG1 in the X direction. The facets 372F may refer to the top surfaces of the source and drain regions 372, which are inclined at a desired (and/or alternatively predetermined) inclination. The facets 372F may be rounded top surfaces as shown in FIG. 3, but inventive concepts are not limited thereto.

To form the source and drain regions 372, recesses 372R may be formed by removing portions of the one pair of fin-type active regions F1A and F1B. Thereafter, a semiconductor layer used to form the source and drain regions 372 may be formed in the recesses 372R by using an epitaxial growth process. In example embodiments, source and drain regions 372 formed of Si or SiC may be obtained. An N+ doping process may be performed during the epitaxial growth of the semiconductor layer formed of Si or SiC in the first region I.

As shown in FIG. 3, portions of the source and drain regions 372 disposed adjacent to both sides of the high-level isolation layer 130, from among the source and drain regions 372 formed in the one pair of fin-type active regions F1A and F1B, may vertically overlap the insulating spacers 210 and have tuck shapes that are pushed into portions disposed under the insulating spacers 210.

Since the IC device 300 described with reference to FIG. 3 includes the source and drain regions 372 including the facet 372F, distances between the first and second dummy gates DG1_1 and DG1_2 and the source and drain regions 372 may be ensured. Accordingly, a leakage current caused by parasitic capacitances between the first and second dummy gates DG1_1 and DG1_2 and the source and drain regions 372 may be effectively reduced and/or inhibited.

Figure 4:
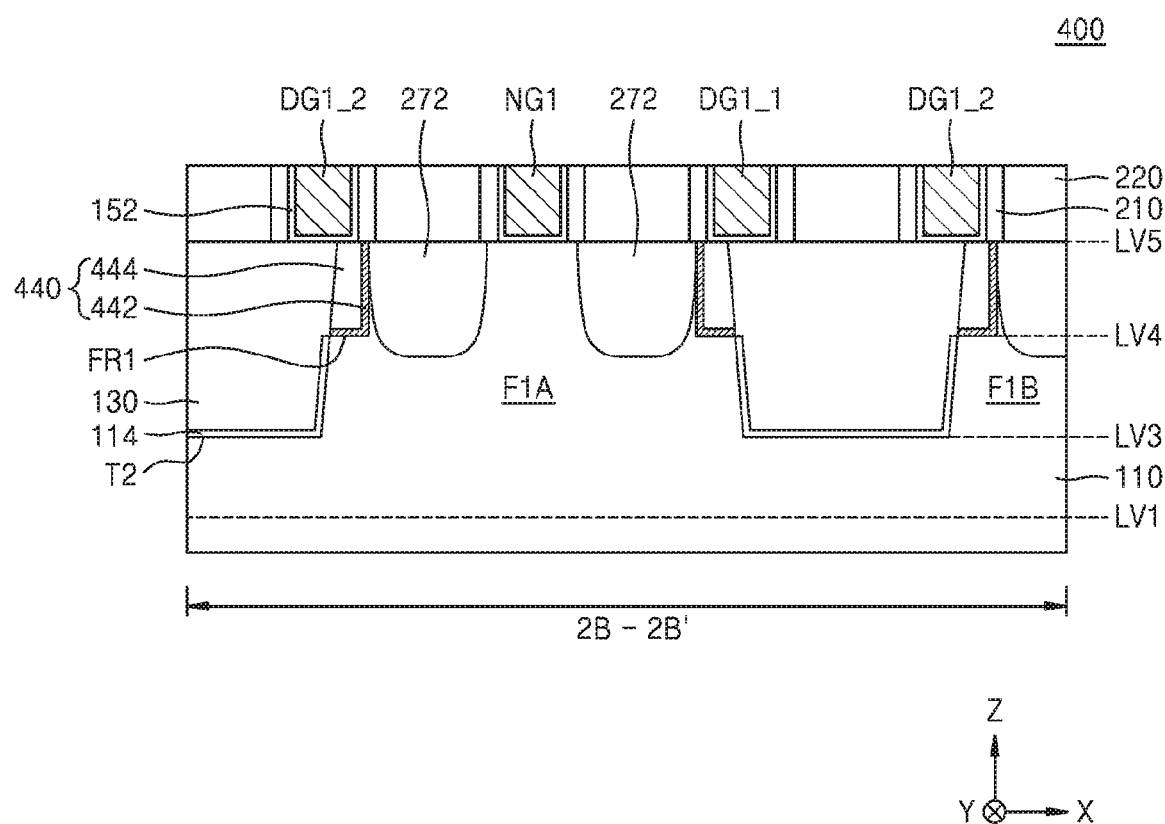
FIG. 4 is a partial cross-sectional view of an IC device according to example embodiments.

FIG. 4 is a partial cross-sectional view of an IC device according to example embodiments, which may have the same plan layout as shown in FIG. 2A. Specifically, FIG. 4 is a cross-sectional view of a portion corresponding to the cross-sectional view taken along the line 2B-2B' of FIG. 2A. In FIG. 4, the same elements as in FIGS. 1A to 2D are denoted by the same reference numerals, and detailed descriptions thereof are omitted.

Referring to FIG. 4, the IC device 400 may have about the same configuration as the IC device 200 described with reference to FIGS. 2A to 2D. However, a step insulation layer 440 may include an insulation liner 442, which is in contact with a stepped portion FR1, and a gap-fill insulating layer 444 formed on the insulation liner 442 to fill the remaining portion the stepped portion FR1.

As shown in FIG. 4, stepped portions FR1, each of which includes a sidewall portion and a bottom portion, may be formed on a pair of second sidewalls (refer to FW2 in FIG. 2A) of a pair of fin-type active regions F1A and F1B. An insulation liner 442 may be conformally formed on the sidewall portion and the bottom portion of the stepped portion FR1.

The gap-fill insulating layer 444 may be formed to fill a space between the stepped portions FR1 of the one pair of fin-type active regions F1A and F1B and a high-level isolation layer 130. The insulation liner 442 may be interposed between the gap-fill insulating layer 444 and the one pair of fin-type active regions F1A and F1B so that the gap-fill insulating layer 444 may be limited (and/or prevented) from being in direct contact with the one pair of fin-type active regions F1A and F1B.

In example embodiments, the insulation liner 442 may include an oxide layer obtained by oxidizing the surfaces of the one pair of fin-type active regions F1A and F1B. For example, the insulation liner 442 may be formed by using an in-situ steam generation (ISSG) process, a thermal oxidation process, a UV oxidation process, or an O2 plasma oxidation process. In example embodiments, the insulation liner 442 may include an oxide layer formed by using a CVD process or an ALD process. The insulation liner 442 may have a thickness of about 10 Å to about 100 Å.

In example embodiments, the gap-fill insulating layer 444 may include an oxide layer formed by using an FCVD process or a spin coating process. For example, the gap-fill insulating layer 444 may be formed of FSG, USG, BPSG, PSG, FOX, PE-TEOS, or TOSZ. In example embodiments, the oxide layer forming the gap-fill insulating layer 444 may include the same material as the oxide layer forming the low-level isolation layer 120 and the oxide layer forming the high-level isolation layer 130. In example embodiments, the oxide layer forming the gap-fill insulating layer 444 may include a different material from the oxide layer forming the low-level isolation layer 120 and the oxide layer forming the high-level isolation layer 130.

Figure 5:
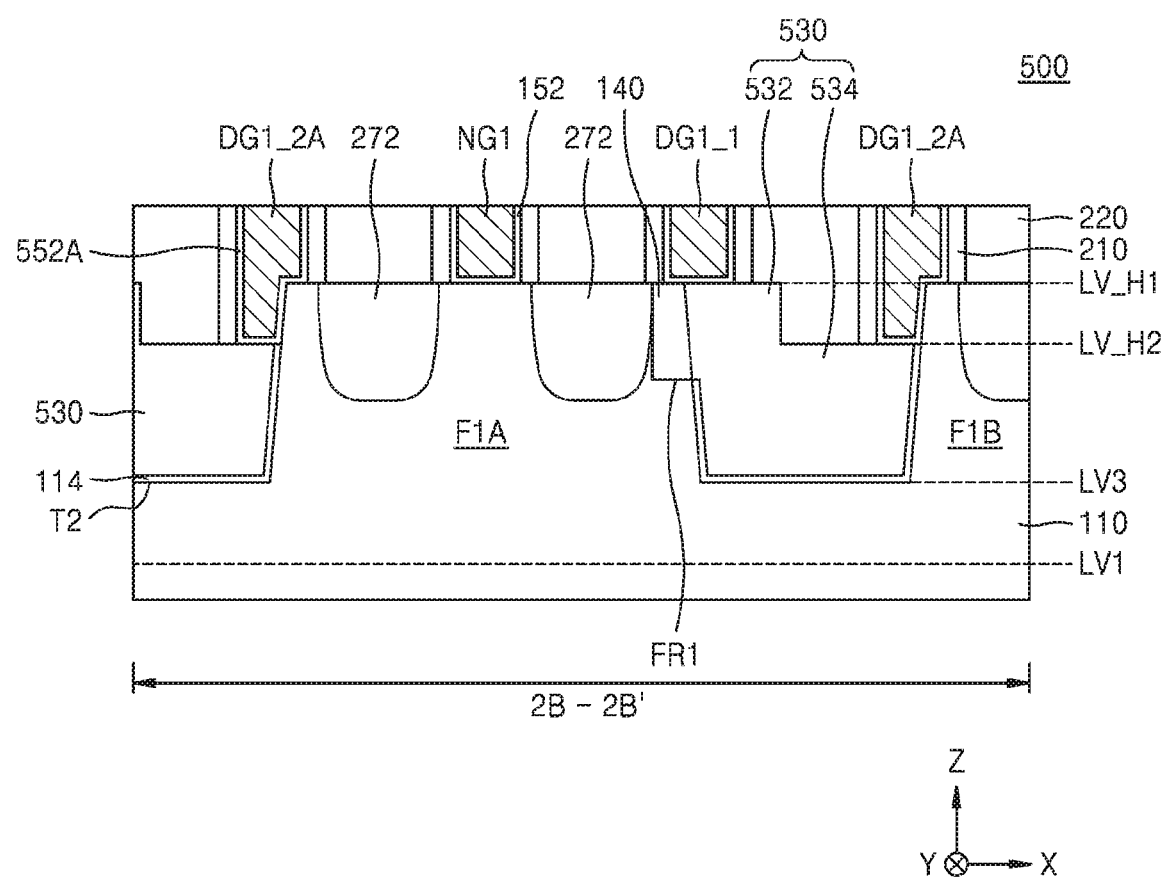
FIG. 5 is a partial cross-sectional view of an IC device according to example embodiments.

FIG. 5 is a partial cross-sectional view of an IC device 500 according to example embodiments, which may have the same plan layout as shown in FIG. 2A. Specifically, FIG. 5 is a cross-sectional view of a portion corresponding to the cross-sectional view taken along a line 2B-2B' of FIG. 2A. In FIG. 5, the same elements as in FIGS. 1A to 2D are denoted by the same reference numerals, and detailed descriptions thereof are omitted.

Referring to FIG. 5, the IC device 500 may have about the same configuration as the IC device 200 described with reference to FIGS. 2A to 2D. However, stepped portions FR1 may be formed on only one second sidewalls (refer to FW2 in FIG. 2A) of each of a pair of fin-type active regions F1A and F1B, and a high-level isolation layer 530 may include a first portion 532 and a second portion 534 having top surfaces disposed at different levels.

As shown in FIG. 5, since the stepped portion FR1 is formed on only one second sidewall FW2 of the pair of second sidewalls FW2 of the one pair of fin-type active regions F1A and F1B, a step insulation layer 140 may be formed only between one of the pair of second sidewalls FW2 and the first portion 532 of the high-level isolation layer 530.

A top level LV_H1 of the first portion 532 of the high-level isolation layer 530 may be higher than or substantially equal to a top level of the one pair of fin-type active regions F1A and F1B. A top level LV_H2 of the second portion 534 of the high-level isolation layer 530 may be lower than the top level of the one pair of fin-type active regions F1A and F1B. In example embodiments, the top level LV_H2 of the second portion 534 of the high-level isolation layer 530 may be substantially equal to a top level of the low-level isolation layer (refer to 120 in FIG. 2C), but inventive concepts are not limited thereto.

The first portion 532 of the high-level isolation layer 530 may come in contact with the step insulation layer 140. The top level LV_H1 of the first portion 532 of the high-level isolation layer 530 may be substantially equal to a top level of the step insulation layer 140 so that the step insulation layer 140 and the first portion 532 of the high-level isolation layer 530 may have relatively planar top surfaces.

The second portion 534 of the high-level isolation layer 530 may come in contact with the second sidewall FW2 on which the stepped portion FR1 is not formed, from among the one pair of second sidewalls FW2 of each of the one pair of fin-type active regions F1A and F1B. Since the top level LV_H2 of the second portion 534 of the high-level isolation layer 530 is lower than the top level of the one pair of fin-type active regions F1A and F1B, the second sidewall FW2 on which the stepped portion FR1 is not formed, from among the one pair of second sidewalls FW2, may be exposed on the second portion 534 of the high-level isolation layer 530.

A second dummy gate DG1_2A may be disposed on the exposed second sidewall FW2. As shown in FIG. 5, the second dummy gate DG1_2A may vertically overlap the top surfaces and the second sidewalls FW2 of the one pair of fin-type active regions F1A and F1B and the second portion 534 of the high-level isolation layer 530. A gate insulating layer 552A may be between the top surfaces and the second sidewalls FW2 of the one pair of fin-type active regions F1A and F1B and the second portion 534 of the high-level isolation layer 530 and the second dummy gate DG1_2A. A bottom surface of the second dummy gate DG1_2A may be disposed at a lower level than a bottom surface of the first dummy gate DG1_1.

Figure 6:
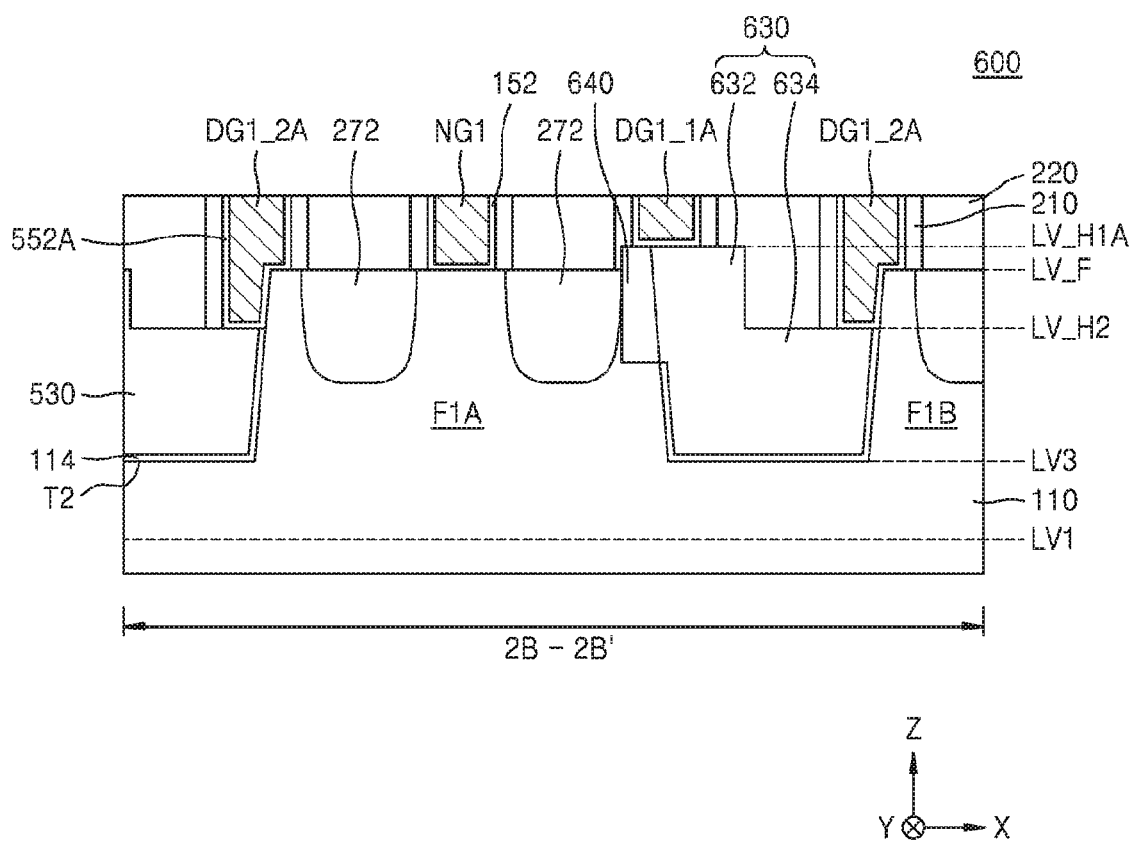
FIG. 6 is a partial cross-sectional view of an IC device according to example embodiments.

FIG. 6 is a partial cross-sectional view of an IC device 600 according to example embodiments, which may have the same plan layout as shown in FIG. 2A. Specifically, FIG. 6 is a cross-sectional view of a portion corresponding to the cross-sectional view taken along a line 2B-2B' of FIG. 2A.

In FIG. 6, the same elements as in FIGS. 1A to 2D are denoted by the same reference numerals, and detailed descriptions thereof are omitted.

Referring to FIG. 6, the IC device 600 may have about the same configuration as the IC device 200 described with reference to FIGS. 2A to 2D. However, a top level LV_H1A of a step insulation layer 640 and a first portion 632 of a high-level isolation layer 630 may be higher than a top level LV_F of the one pair of fin-type active regions F1A and F1B. Also, a first dummy gate DG1_1A may vertically overlap the step insulation layer 640 and the first portion 632 of the high-level isolation layer 630, and a bottom surface of the first dummy gate DG1_1A may be disposed at a higher level than the top level LV_F of the one pair of fin-type active regions F1A and F1B.

Since the top level LV_H1A of the step insulation layer 640 and the first portion 632 of the high-level isolation layer 630 is higher than the top level LV_F of the one pair of fin-type active regions F1A and F1B, the amount of insulating material contained in the high-level isolation layer 630 and the step insulation layer 640 may increase. Accordingly, tensile strain caused by the shrinkage of the step insulation layer 640 and the high-level isolation layer 630 may increase, and higher stress may be applied to the one pair of fin-type active regions F1A and F1B.

Also, since a bottom surface of the first dummy gate DG1_1A is disposed at a higher level than the top level LV_F of the one pair of fin-type active regions F1A and F1B, a parasitic capacitance between the first dummy gate DG1_1A and the one pair of fin-type active regions F1A and F1B may be reduced, and a distance between the first dummy gate DG1_1A and the one pair of fin-type active regions F1A and F1B may be ensured to inhibit occurrence of a leakage current.

Meanwhile, a top level LV_2 of a second portion 634 of the high-level isolation layer 630 may be substantially equal to a top level of the low-level isolation layer (refer to 120 in FIG. 2C), but inventive concepts are not limited thereto.

Figure 7A:
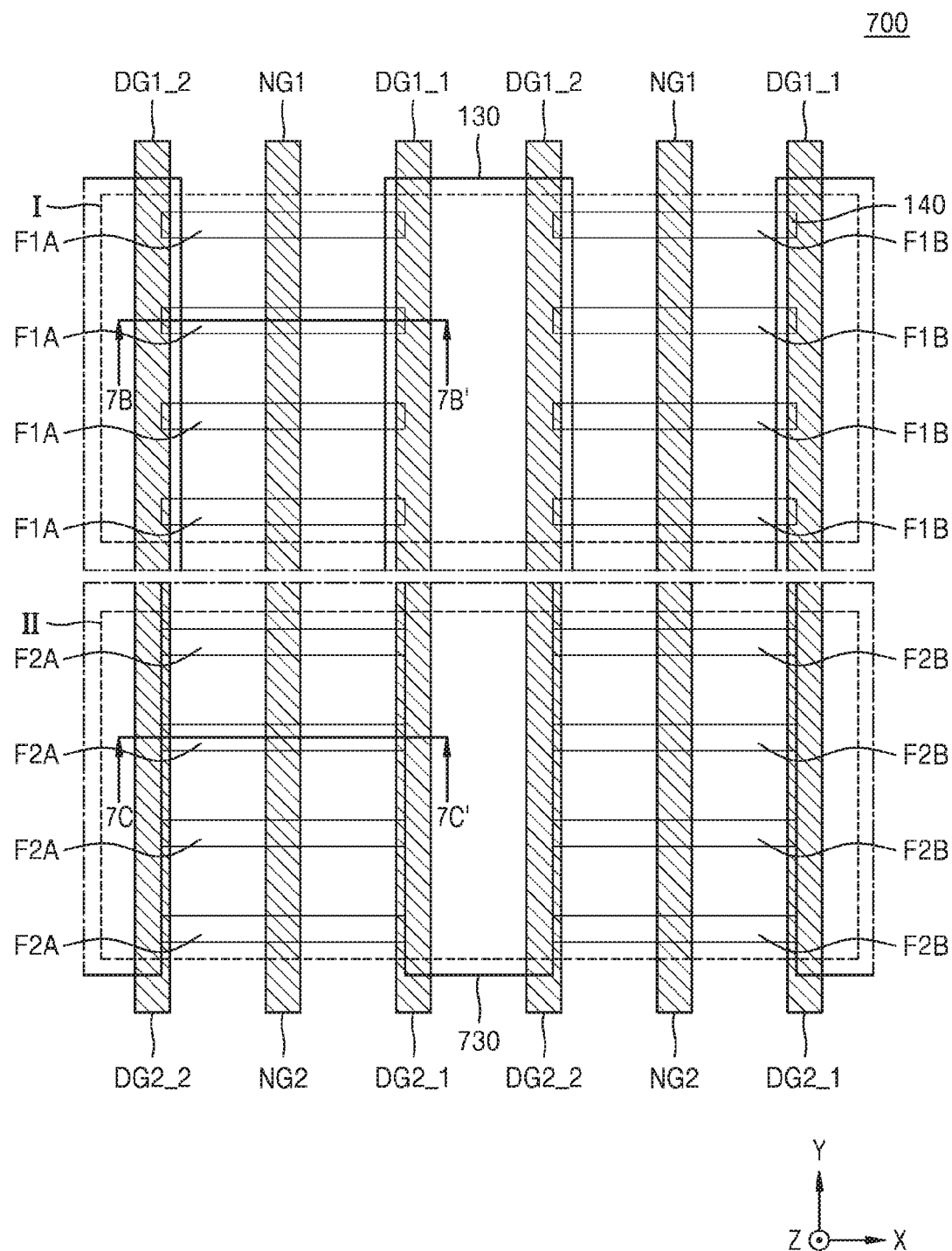
FIG. 7A is a plan layout diagram of essential parts of an IC device according to example embodiments.

FIG. 7A is a plan layout diagram of essential parts of an IC device according to example embodiments. FIGS. 7B and 7C are cross-sectional views taken along lines 7B-7B' and 7C-7C' of FIG. 7A. In FIGS. 7A to 7C, the same elements as in FIGS. 1A to 6 are denoted by the same reference numerals, and detailed descriptions thereof are omitted.

Referring to FIGS. 7A to 7C, the IC device 700 may include a substrate 110 having a first region I and a second region II. The first region I and the second region II of the substrate 110 refer to different regions of the substrate 110 and may be regions that require different threshold voltages. For example, the first region I may be an NMOS region, and the second region II may be a PMOS region.

A pair of first fin-type active regions F1A and F1B may be disposed in the first region I of the substrate 110 and protrude in a Z direction from a main surface of the substrate 110. One pair of first normal gates NG1 may extend in a Y direction on the one pair of first fin-type active regions F1A and F1B. First and second dummy gates DG1_1 and DG1_2 may be disposed apart from one another between the one pair of first normal gates NG1 and extend parallel to the one pair of first normal gates NG1. A first high-level isolation layer 130 may be formed to fill a first trench T11, which may extend in the Y direction between the one pair of first fin-type active regions F1A and F1B. The first and second dummy gates DG1_1 and DG1_2 may be disposed on the first high-level isolation layer 130. Although not shown, third trenches (not shown) may be formed. The third trenches may extend in the X direction in both sides of the one pair of first fin-type active regions F1A and F1B in an extension direction of the one pair of first fin-type active regions F1A and F1B. A first low-level isolation layer (not shown) may be formed to fill the third trenches.

A step insulation layer 140 may be formed between the first high-level isolation layer 130 and at least one sidewall of the one pair of first fin-type active regions F1A and F1B. A first gate insulating layer 152 may be interposed between the first high-level isolation layer 130 and the step insulation layer 140, and first and second dummy gates DG1_1 and DG1_2. First source and drain regions 272 may be formed in portions of the one pair of first fin-type active regions F1A and F1B at both sides of the one pair of first normal gates NG1.

One pair of second fin-type active regions F2A and F2B may be disposed in the second region II of the substrate 110 and protrude in the Z direction from the main surface of the substrate 110. One pair of second normal gates NG2 may extend in the Y direction on the one pair of second fin-type active regions F2A and F2B. Third and fourth dummy gates DG2_1 and DG2_2 may be disposed apart from one another between the one pair of second normal gates NG2 and extend parallel to the one pair of second normal gates NG2. A second high-level isolation layer 730 may be formed to fill a second trench T22, which may extend in the Y direction between the one pair of second fin-type active regions F2A and F2B. The third and fourth dummy gates DG2_1 and DG2_2 may be disposed on the second high-level isolation layer 730. Although not shown, fourth trenches (not shown) may be formed. The fourth trenches may extend in the X direction in both sides of the one pair of second fin-type active regions F2A and F2B in the extension direction of the one pair of second fin-type active regions F2A and F2B. A second low-level isolation layer (not shown) may be formed to fill the fourth trenches.

The third and fourth dummy gates DG2_1 and DG2_2 may vertically overlap the top surfaces and sidewalls of the one pair of second fin-type active regions F2A and F2B and the second high-level isolation layer 730. A second gate insulating layer 752 may be interposed between the top surfaces and sidewalls of the one pair of second fin-type active regions F2A and F2B and the second high-level isolation layer 730, and the third and fourth dummy gates DG2_1 and DG2_2. Second source and drain regions 772 may be formed in portions of the one pair of second fin-type active regions F2A and F2B at both sides of the one pair of second normal gates NG2.

As shown in FIGS. 7B and 7C, a top level LV1 of the first high-level isolation layer 130 formed on the first region I may be substantially equal to or higher than a top level LV3 of the one pair of second fin-type active regions F2A and F2B. Also, a top level LV2 of the second high-level isolation layer 730 disposed on the second region II may be lower than a top level LV3 of the one pair of second fin-type active regions F2A and F2B. Accordingly, the top level LV1 of the first high-level isolation layer 130 disposed on the first region I may be higher than the top level LV2 of the second high-level isolation layer 730 disposed on the second region II.

Also, bottom surfaces of the first and second dummy gates DG1_1 and DG1_2 disposed on the first region I may be disposed at a higher level than bottom surfaces of the third and fourth dummy gates DG2_1 and DG2_2 disposed on the second region II.

In the IC device 700 described with reference to FIGS. 7A to 7C, the step insulation layer 140 may be formed in the first region I, while the step insulation layer 140 may not be formed in the second region II. Also, the top level LV1 of the first high-level isolation layer 130 disposed on the first region I may be higher than the top level LV2 of the second high-level isolation layer 730 disposed on the second region II. The amount of insulating material included in the first high-level isolation layer 130 and the step insulation layer 140 may be higher in the first region I than in the second region II. Accordingly, due to tensile strain caused by the shrinkage of the insulating material, a higher tensile stress may be applied to the one pair of first fin-type active regions F1A and F1B than to the one pair of second fin-type active regions F2A and F2B.

In general, a tensile stress may improve the carrier mobility of an NMOS transistor and reduce the carrier mobility of a PMOS transistor. Accordingly, when NMOS transistors are formed in the one pair of first fin-type active regions F1A and F1B and PMOS transistors are formed in the one pair of second fin-type active regions F2A and F2B, degradation of the carrier mobility in the PMOS transistors may be minimized, while the carrier mobility in the NMOS transistors may be improved. As a result, in example embodiments, the performance of the IC device 700 including the NMOS transistors and the PMOS transistors may be improved.

Figure 8:
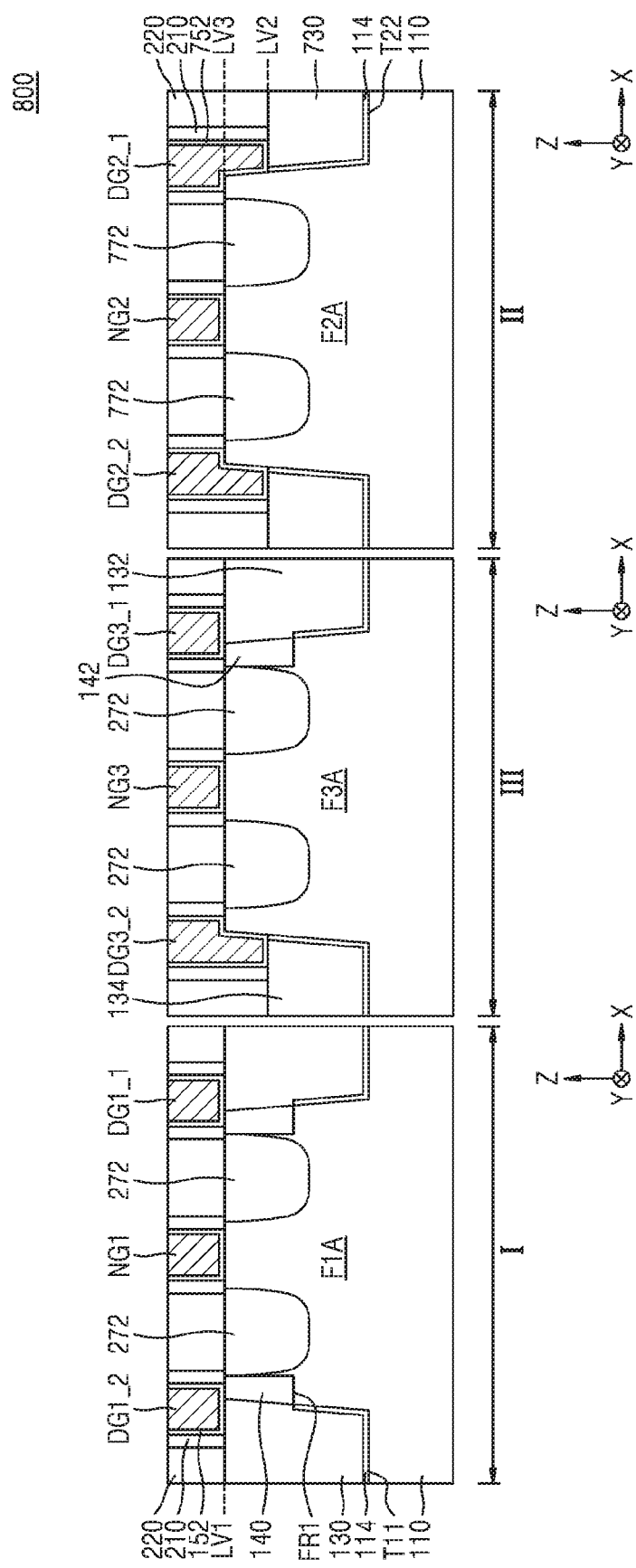
FIG. 8 is a partial cross-sectional view of an IC device according to example embodiments.

FIG. 8 is a diagram of an IC device 800 according to example embodiments. In FIG. 8, the same elements as in FIGS. 1A to 7B are denoted by the same reference numerals, and detailed descriptions thereof are omitted.

Referring to FIG. 8, the IC device 800 may have about the same configuration as the IC device 700 described with reference to FIGS. 7A to 7C. However, the IC device 800 may further include a third region III having one pair of third fin-type active region F3A. The third region III may be an NMOS region, but inventive concepts are not limited thereto.

A third high-level isolation layer 132 and a fourth high-level isolation layer 134 may be respectively formed on both sides of one third fin-type active region F3A of the one pair of third fin-type active regions F3A. The third high-level isolation layer 132 may have similar characteristics to those of the first high-level isolation layer 130 described with reference to FIGS. 7A to 7C, and the fourth high-level isolation layer 134 may have similar characteristics to those of the second high-level isolation layer 730 described with reference to FIGS. 7A to 7C.

One pair of third normal gate NG3 may extend in a Y direction on the one pair of third fin-type active region F3A, and fifth and sixth dummy gates DG3_1 and DG3_2 may be disposed apart from one another on both sides of one third normal gate NG3 of the one pair of third normal gate NG3. The fifth dummy gates DG3_1 may be formed on the third high-level isolation layer 132 and a step insulation layer 142, and have similar characteristics to those of the first and second dummy gates DG1_1 and DG1_2 described with reference to FIGS. 7A to 7C. The sixth dummy gate DG3_2 may be formed on the fourth high-level isolation layer 134 and have similar characteristics to those of the third and fourth dummy gates DG2_1, DG2_2 described with reference to FIGS. 7A to 7C.

Figure 9:
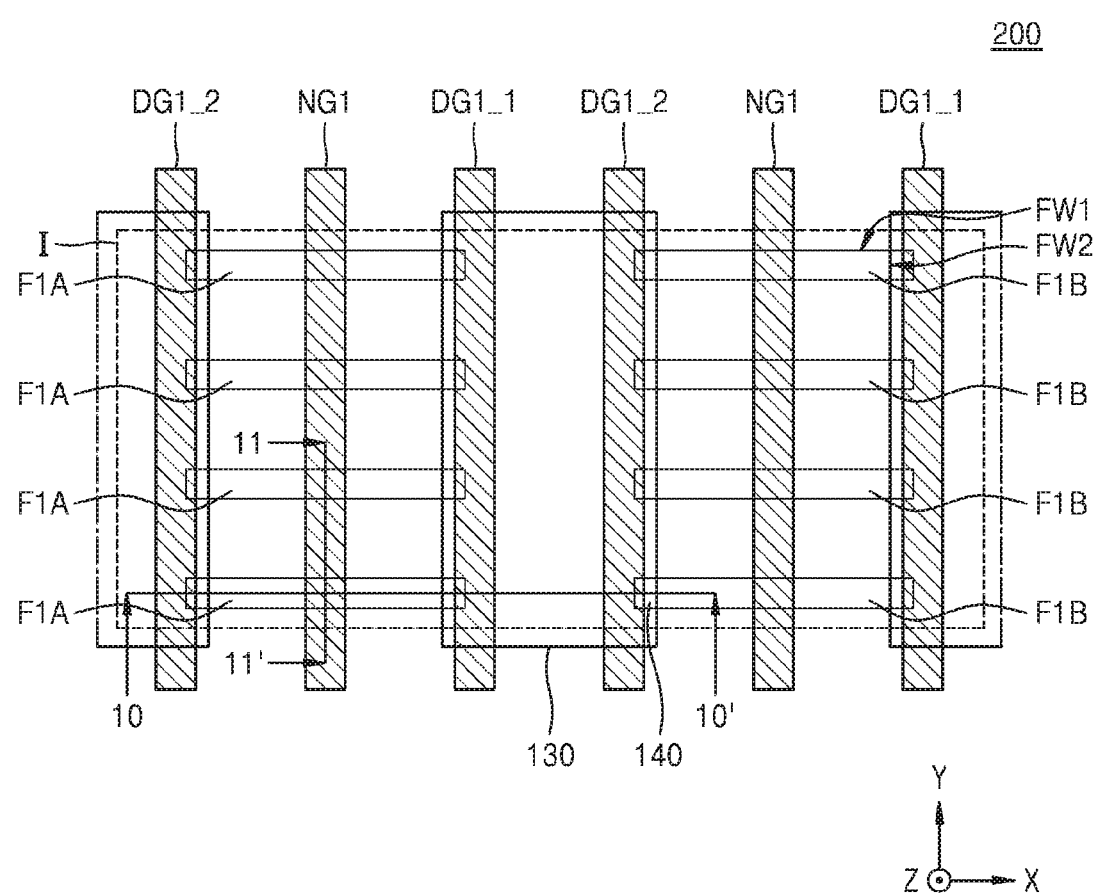
FIG. 9 is a plan view of an IC device according to example embodiments.

FIG. 9 is a plan view of an IC device according to example embodiments. The plan view in FIG. 9 may be the same as the plan view in FIG. 2A. FIGS. 10A to 10O and FIGS. 11A to 11O are cross-sectional views, taken along lines 10-10' and 11-11' of FIG. 9 respectively, for explaining a method of manufacturing an IC device according to example embodiments. In FIGS. 9, 10A to 10O and 11A to 11O, the same elements as in FIGS. 2A to 2D are denoted by the same reference numerals, and detailed descriptions thereof are omitted. The method described with reference to FIGS. 10A to 10O and 11A to 11O may be used to manufacture the IC device 200 described in FIGS. 2A to 2D.

Referring to FIGS. 10A and 11A, a first pad oxide layer pattern 812 and a first mask pattern 814 may be formed on a substrate 110. The first pad oxide layer pattern 812 and the first mask pattern 814 may extend on the substrate 110 parallel to one another in one direction (Y direction).

In example embodiments, the first pad oxide layer pattern 812 may include an oxide layer obtained by thermally oxidizing the surface of the substrate 110. The first mask pattern 814 may be formed of a silicon nitride layer, a silicon oxynitride layer, a spin on glass (SOG) layer, a spin on hardmask (SOH) layer, a photoresist layer, or a combination thereof, but inventive concepts are not limited to the examples.

Referring to FIGS. 10B and 11B, a partial region of the substrate 110 may be etched by using the first mask pattern 814 as an etch mask, thereby forming a stepped portion FR1 in the substrate 110. The stepped portion FR1 may include a bottom portion FR1_B and a sidewall portion FR1_W, which may have a desired (and/or alternatively predetermined) depth from a top surface of the substrate 110. The stepped portion FR1 may extend in one direction (Y direction) in the substrate 110. In example embodiments, the bottom portion FR1_B of the stepped portion FR1 may be inclined at an inclination of about 0° to about 30° with respect to a main surface of the substrate 110, and the sidewall portion FR1_W of the stepped portion FR1 may be inclined at an inclination of about 60° to 90° with respect to the main surface of the substrate 110.

Referring to FIGS. 10C and 11C, the top surface of the substrate 110 may be exposed again by removing the first pad oxide layer pattern 812 and the first mask pattern 814.

Thereafter, an insulating layer (not shown) may be formed on the substrate 110, and an upper portion of the insulating layer may be planarized until the top surface of the substrate 110 is exposed, thereby forming a step insulation layer 140 to fill the stepped portion FR1. In example embodiments, the step insulation layer 140 may be formed of FSG, USG, BPSG, PSG, FOX, PE-TEOS, or TOSZ by using an FCVD process or a spin coating process.

Optionally, before and/or after the upper portion of the insulating layer is planarized, an annealing process may be performed on the substrate 110.

Although not shown in FIGS. 10C and 11C, an insulation (refer to 442 in FIG. 4) having a desired (and/or alternatively predetermined) thickness may be formed on an inner wall of the stepped portion FR1, and a gap-fill insulating layer (refer to 444 in FIG. 4) may be formed on the insulation liner 142 to fill the inside of the stepped portion FR1. In this case, the IC device 400 described with reference to FIG. 4 may be manufactured.

Referring to FIGS. 10D and 11D, a plurality of second pad oxide layer patterns 822 and a plurality of second mask patterns 824 may be formed on the substrate 110. The plurality of second pad oxide layer patterns 822 and the plurality of second mask patterns 824 may extend on the substrate 110 parallel to one another in one direction (X direction).

In example embodiments, as shown in FIGS. 10D and 11D, the plurality of second mask patterns 824 may be disposed to cover a portion of a top surface of the step insulation layer 140 and expose a portion of the top surface of the step insulation layer 140. In example embodiments, the plurality of second mask patterns 824 may be disposed to cover a portion of the top surface of the step insulation layer 140 such that sidewalls of the plurality of second mask patterns 824 are aligned with sidewalls of the step insulation layer 140.

Referring to FIGS. 10E and 11E, a partial region of the substrate 110 may be etched by using the plurality of second mask patterns 824 as an etch mask, thereby forming a plurality of first and second trenches T1 and T2 in the substrate 110 to extend in perpendicular directions to one another.

In example embodiments, the plurality of first trenches T1 may extend in the X direction parallel to one another, and the plurality of second trenches T2 may extend in the Y direction parallel to one another. The plurality of first trenches T1 may communicate with the plurality of second trenches T2.

Due to the formation of the plurality of first and second trenches T1 and T2, a plurality of fin-type active regions F1A may be formed. The plurality of fin-type active regions F1A may protrude upward from the substrate 110 in a direction (Z direction) perpendicular to the main surface of the substrate 110 and extend in one direction (X direction).

During the etching process for forming the plurality of first and second trenches T1 and T2, portions of the step insulation layer 140, which are not covered with the plurality of second mask patterns 824, may be removed, and only portions of the step insulation layer 140 disposed under the plurality of second mask patterns 824 may remain.

Figures 10F, 11F:
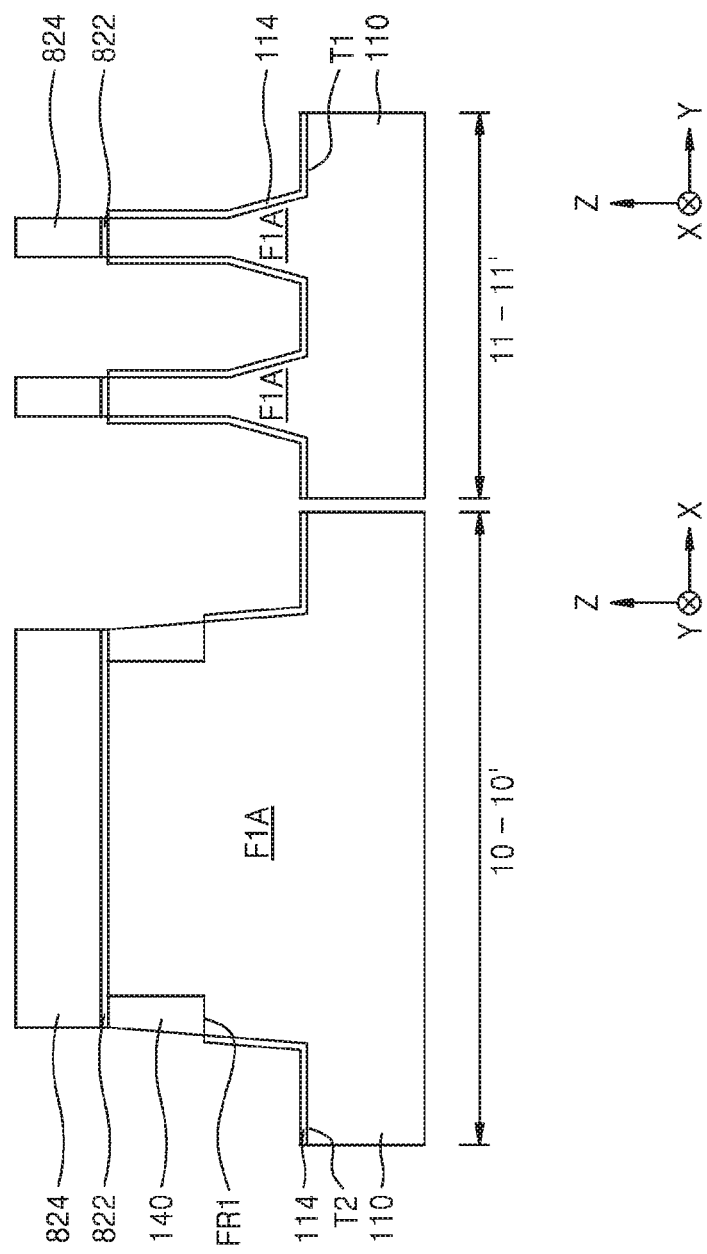
FIGS. 10A to 10O and FIGS. 11A to 11O are cross-sectional views, taken along lines 10-10' and 11-11' of FIG. 9 respectively, for explaining process operations of a method of manufacturing an IC device according to example embodiments.

Referring to FIGS. 10F and 11F, a process of oxidizing exposed surfaces of the plurality of fin-type active regions F1A may be performed to form a liner 114 covering the exposed surfaces of the plurality of fin-type active regions F1A. For example, the liner 114 may be formed by using an ISSG process, a thermal oxidation process, a UV oxidation process, or an oxygen (e.g., $O_2$) plasma oxidation process.

Meanwhile, the liner 114 may not be formed on the exposed surface of the step insulation layer 140 during the oxidation process.

Referring to FIGS. 10G and 11G, a high-level isolation layer 130 and a low-level isolation layer 120 may be formed to fill the plurality of first and second trenches T1 and T2, respectively. In example embodiments, the high-level isolation layer 130 and the low-level isolation layer 120 may be formed of FSG, USG, BPSG, PSG, FOX, PE-TEOS, or TOSZ by using an FCVD process or a spin coating process.

Optionally, an annealing process may be performed on the substrate 110 having the high-level isolation layer 130 and the low-level isolation layer 120.

Referring to FIGS. 10H and 11H, a deep trench DT may be formed by removing portions of the plurality of fin-type active regions F1A and the low-level and high-level isolation layers 120 and 130 that surround the plurality of fin-type active regions F1A. The deep trench DT may be formed to have a greater depth than depths of the plurality of first and second trenches T1 and T2. For example, the deep trench DT may have a depth by about 50 nm to about 150 nm greater than the depths of the plurality of first and second trenches T1 and T2.

In example embodiments, to form the deep trench DT, a photoresist pattern (not shown) may be formed on the resultant structure of FIGS. 10G and 11G to expose a portion of a top surface of the resultant structure of FIG. 11G, and the exposed portion of the top surface of the resultant structure may be dry etched by using the photoresist pattern as an etch mask.

Referring to FIGS. 10I and 11I, an insulating layer (not shown) may be formed by using a coating process or a deposition process to fill the deep trench DT. Thereafter, a top surface of the insulating layer may be planarized until the plurality of second mask patterns (refer to 824 in FIG. 10H) are exposed, thereby forming a field insulating layer 112 to fill the deep trench DT.

In example embodiments, the field insulating layer 112 may be formed of a different material from the low-level and high-level isolation layers 120 and 130. For example, the low-level and high-level isolation layers 120 and 130 may include an oxide layer formed by using an FCVD process, and the field insulating layer 112 may be formed of USG, but inventive concepts are not limited thereto.

Thereafter, the plurality of second mask patterns (refer to 824 in FIG. 10H), the plurality of second pad oxide layer patterns (refer to 822 in FIG. 10H), and partial upper portions of the low-level and high-level isolation layers 120 and 130 may be removed to expose upper portions of the plurality of fin-type active regions F1A.

In example embodiments, an ion implantation process for controlling a threshold voltage may be performed on the exposed upper portions of the plurality of fin-type active regions F1A. For example, boron (B) ions may be implanted into the exposed upper portions of the plurality of fin-type active regions F1A.

Referring to FIGS. 10J and 11J, a hard mask layer 830 may be formed on the plurality of fin-type active regions F1A and the low-level and high-level isolation layers 120 and 130. A third mask pattern 832 having an opening 832H may be formed on the hard mask layer 830 and vertically overlap the high-level isolation layer 130 and the step insulation layer 140. The opening 832H may extend in the Y direction on the hard mask layer 830.

The hard mask layer 830 may be formed of a material having an etch selectivity with respect to the plurality of fin-type active regions F1A, the low-level and high-level isolation layers 120 and 130, and the step insulation layer 140. For example, hard mask layer 830 may include a nitride layer, an SOH layer, or a combination thereof, but inventive concepts are not limited thereto.

The third mask pattern 832 may include a photoresist pattern, but inventive concepts are not limited thereto.

Referring to FIGS. 10K and 11K, the hard mask layer (refer to 830 in FIG. 10J) may be etched by using the third mask pattern 832 as an etch mask, thereby forming a hard mask pattern 830P having an opening 830H. Top surfaces of the step insulation layer 140 and the high-level isolation layer 130 may be exposed by the opening 830H.

Subsequently, the third mask pattern 832 may be removed.

Referring to FIGS. 10I and 11I, an insulating layer (not shown) may be formed on top surfaces of the hard mask pattern 830P, the step insulation layer 140, and the high-level isolation layer 130, and an upper portion of the insulating layer may be planarized until the top surface of the hard mask pattern 830P is exposed, thereby forming a sacrificial insulating layer 840 to fill the opening 830H.

In example embodiments, the sacrificial insulating layer 840 may be formed of FSG, USG, BPSG, PSG, FOX, PE-TEOS, or TOSZ by using an FCVD process or a spin coating process. In example embodiments, the sacrificial insulating layer 840 may be formed of the same material as the low-level and high-level isolation layers 120 and 130. In example embodiments, the sacrificial insulating layer 840 may be formed of a different material from the low-level and high-level isolation layers 120 and 130.

Referring to FIGS. 10M and 11M, top surfaces of the plurality of fin-type active regions F1A may be exposed again by removing the hard mask pattern (refer to 830P in FIGS. 10L and 11L).

Meanwhile, the top surfaces of the step insulation layer 140 and the high-level isolation layer 130 may be covered by the sacrificial insulating layer 840 and may not be exposed.

Referring to FIGS. 10N and 11N, an etchback process may be performed on the low-level isolation layer 120 to expose top surfaces and sidewalls of upper portions U1 of the plurality of fin-type active regions F1A, thereby removing a partial upper portion of the low-level isolation layer 120.

During the etchback process for removing the low-level isolation layer 120, the exposed portion of the sacrificial insulating layer 840 may also be removed. Since the step insulation layer 140 and high-level isolation layer 130 are covered by the sacrificial insulating layer 840, the step insulation layer 140 and the high-level isolation layer 130 may not be removed during the etchback process.

Referring to FIGS. 10O and 11O, a gate insulating layer 152 may be formed to cover the exposed upper portions of the plurality of fin-type active regions F1A, and a normal gate NG1 may be formed on the gate insulating layer 152. Meanwhile, during the formation of the gate insulating layer 152 and the normal gate NG1, a gate insulating layer 152 and first and second dummy gates DG1_1 and DG1_2 may be simultaneously formed on the high-level isolation layer 130 and the step insulation layer 140.

Thereafter, source and drain regions 272 may be formed on both sides of the plurality of fin-type active regions F1A. A portion of each of the plurality of fin-type active regions F1A disposed under the normal gate NG1 may be provided as a channel region CHA.

In example embodiments, the normal gate NG1 and the first and second dummy gates DG1_1 and DG1_2 may be formed by using an RPG process. For example, a plurality of insulating spacers 210 and an inter-gate dielectric layer 220 may be formed to provide a plurality of gate spaces. Thereafter, the gate insulating layer 152, the normal gate NG1, and the first and second dummy gates DG1_1 and DG1_2 may be formed in the plurality of gate spaces defined by the plurality of insulating spacers 210.

The IC device 200 shown in FIGS. 2A to 2D may be completed by using the above-described process.

Unlike the example shown in FIGS. 10L, 10M, 11L, and 11M, when the sacrificial insulating layer 840 is formed to completely cover the step insulation layer 140 and not to cover a portion of the high-level isolation layer (refer to 530 in FIG. 5) (e.g., when the sacrificial insulating layer 840 has a smaller width in the X direction), the portion of the high-level isolation layer 530, which is not covered by the sacrificial insulating layer 840, may also be removed during the etchback process of the low-level isolation layer 120 described with reference to FIGS. 10N and 11N. Thus, the high-level isolation layer 530 having the first portion (refer to 532 in FIG. 5) and the second portion (refer to 534 in FIG. 5) having different levels may be formed. As a result, the IC device 500 described with reference to FIG. 5 may be manufactured.

Unlike the example shown in FIGS. 10C and 11C, when the step insulation layer (refer to 640 in FIG. 6) is formed to have a top surface disposed at a higher level than the top surface of the substrate 110, the top level (refer to LV_H1A in FIG. 6) of the step insulation layer 640 may remain higher than the top level (refer to LV_F in FIG. 6) of the plurality of fin-type active regions F1A during the etchback process of the low-level isolation layer 120 described with reference to FIG. 10N. As a result, the IC device 600 described with reference to FIG. 6 may be manufactured.

Unlike the example shown in FIGS. 10O and 11O, after the recess (refer to 372R in FIG. 3) is formed by removing portions of the plurality of fin-type active regions F1A disposed on both sides of the normal gate NG1, an epitaxially grown semiconductor layer may be formed on the portions of the plurality of fin-type active regions F1A, which are exposed by the recess 372R, by using an epitaxial growth process. In this case, source and drain regions 372 having faceted structures may be formed. As a result, the IC device 300 described with reference to FIG. 3 may be manufactured.

FIGS. 12A to 12G and 13A to 13G are cross-sectional views for explaining a method of manufacturing an IC device according to example embodiments. The method described in FIGS. 12A to 12G and 13A to 13G may be used to manufacture the IC device 700 shown in FIGS. 7A to 7C. FIGS. 12A to 12G correspond to FIG. 7B and FIGS. 13A to 13G correspond to FIG. 7C. In FIGS. 12A to 12G and 13A to 13G, the same elements as in FIGS. 7A to 7C are denoted by the same reference numerals and detailed descriptions thereof are omitted.

Referring to FIGS. 12A and 13A, a substrate 110 including a first region I and a second region II may be provided. A protection layer 910 may be formed on the second region II of the substrate 110.

Thereafter, processes similar to the processes described with reference to FIGS. 10A to 10C and 11A to 11C may be performed so that a step insulation layer 140 may be formed on the first region I of the substrate 110 to fill a stepped portion FR1 and a stepped portion FR1.

Thereafter, the protection layer 910 may be removed.

Referring to FIGS. 12B and 13B, a plurality of first pad oxide layer patterns 922A and a plurality of first mask patterns 924A may be formed on the first region I of the substrate 110, and a plurality of second pad oxide layer pattern 922B and a plurality of second mask patterns 924B may be formed on the second region II of the substrate 110. The plurality of first pad oxide layer pattern 922A and the plurality of first mask patterns 924A may cover portions of the step insulation layer 140.

Processes similar to the processes described with reference to FIGS. 10E, 10F, 11E, and 11F may be performed, thereby forming a structure shown in FIGS. 12C and 13C.

Specifically, portions of the substrate 110 may be etched by using the plurality of first mask patterns 924A and the plurality of second mask patterns 924B as an etch mask. A first trench T11 and a third trench (not shown) may be formed in the first region I. The first trench T11 may extend in a Y direction, and the third trench may communicate with the first trench T11 and extend in an X direction. A second trench T22 and a fourth trench (not shown) may be formed in the second region II. The second trench T22 may extend in the Y direction, and the fourth trench may communicate with the second trench T22 and extend in the X direction.

Etching processes for forming the first trench T11, the second trench T22, the third trench, and the fourth trench may be performed at the same time. Alternatively, a first etching process for forming the first trench T11 and the third trench may be performed first, and a second etching process for forming the second trench T22 and the fourth trench may be performed.

A plurality of first fin-type active regions F1A may be formed in the first region I by the first trench T11 and the third trench, and a plurality of second fin-type active regions F2A may be formed in the second region II by the second trench T22 and the fourth trench.

Processes similar to the processes described with reference to FIGS. 10G to 10L and 11G to 11L may be performed, thereby forming a structure shown in FIGS. 12D and 13D.

Specifically, a first low-level isolation layer (not shown) filling the third trench and a first high-level isolation layer 130 filling the first trench T11 may be formed. A second low-level isolation layer (not shown) filling the fourth trench and a second high-level isolation layer 730 filling the second trench T22 may be formed.

Thereafter, a first hard mask pattern 930A including an opening 930H may be formed on the first region I to expose top surfaces of the first high-level isolation layer 130 and the step insulation layer 140, and a second hard mask pattern 930B may be formed to cover the entire second region II.

Thereafter, a sacrificial insulating layer 940 may be formed to fill the opening 930H and cover the first high-level isolation layer 130 and the step insulation layer 140.

Referring to FIGS. 12E and 13E, the first hard mask pattern 930A and the second hard mask pattern 930B may be respectively removed from the first region I and the second region II. The sacrificial insulating layer 940 may remain on the first region I.

Subsequently, processes similar to the processes described with reference to FIGS. 10N and 11N may be performed, thereby forming a structure shown in FIGS. 12F and 13F.

Specifically, an etchback process may be performed on the first and second low-level isolation layers to expose top surfaces and upper sidewalls of the plurality of first fin-type active regions F1A and top surfaces and upper sidewalls of the plurality of second fin-type active regions F2A, thereby removing partial upper portions of the first and second low-level isolation layers.

During the etchback process for removing the first and second low-level isolation layers, a portion of the sacrificial insulating layer 940 exposed on the first region I and a portion of the second high-level isolation layer 730 exposed on the second region II may also be removed. Since the step insulation layer 140 and the first high-level isolation layer 130 are covered by the sacrificial insulating layer 840, the step insulation layer 140 and the high-level isolation layer 130 may not be removed during the etchback process.

As shown in FIGS. 12F and 13F, a top level LV1 of the step insulation layer 140 and the first high-level isolation layer 130 of the first region I may be higher than a top level LV2 of the second high-level isolation layer 730 of the second region II. Also, the top level LV2 of the second high-level isolation layer 730 of the second region II may be lower than a top level LV3 of the plurality of second fin-type active regions F2A.

Subsequently, processes similar to the processes described with reference to FIGS. 10O and 11O may be performed, thereby forming the IC device 700 shown in FIGS. 12G and 13G.

Figure 14:
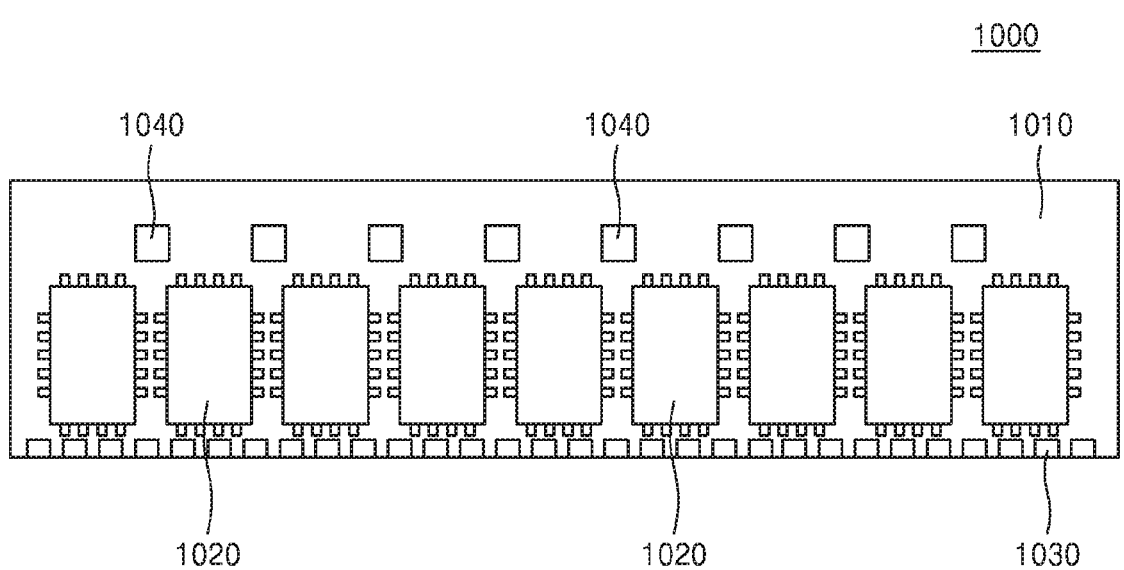
FIG. 14 is a plan view of a memory module according to example embodiments.

FIG. 14 is a plan view of a memory module 1000 according to example embodiments.

The memory module 1000 may include a module substrate 1010 and a plurality of semiconductor chips 1020 adhered to the module substrate 1010.

The semiconductor chip 1020 may include an IC device according to example embodiments. The semiconductor chip 1020 may include at least one of the IC devices 100, 200, 300, 400, 500, 600, 700, and 800 described with reference to FIGS. 1A to 13G according to example embodiments or modified IC devices thereof.

Connectors 1030, which may be inserted into sockets of a motherboard, may be disposed on one side of the module substrate 1010. A decoupling capacitor 1040 may be disposed on the module substrate 1010. The decoupling capacitor 1040 may be formed of a ceramic. The memory module 1000 according to example embodiments is not limited to the configuration shown in FIG. 14 and may be manufactured in various shapes.

Figure 15:
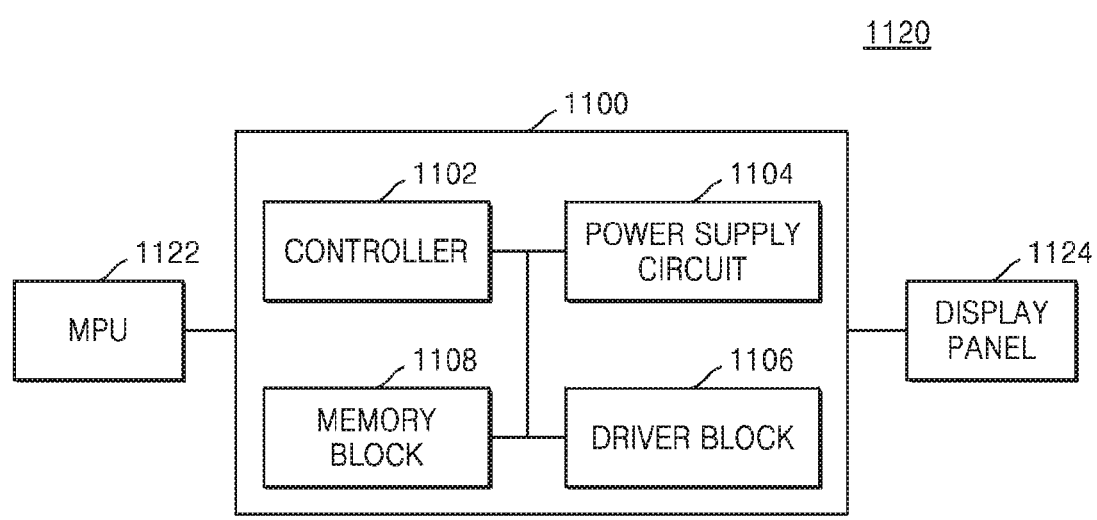
FIG. 15 is a schematic block diagram of a display driver IC (DDI) and a display device including the DDI, according to example embodiments.

FIG. 15 is a schematic block diagram of a display driver IC (DDI) 1100 and a display device 1120 including the DDI 1100, according to example embodiments.

Referring to FIG. 15, the DDI 1100 may include a controller 1102, a power supply circuit 1104, a driver block 1106, and a memory block 1108. The controller 1102 may receive a command from a main processing unit (MPU) 1122, decode the command, and control respective blocks of the DDI 1100 to provide an operation in response to the command. The power supply circuit 1104 may generate a driving voltage under the control of the controller 1102. The driver block 1106 may drive a display panel 1124 by using a driving voltage generated by the power supply circuit 1104 under the control of the controller 1102. The display panel 1124 may be a liquid crystal display (LCD) panel, a plasma display panel (PDP), or an organic light emitting diode (OLED) display panel. The memory block 1108 may be a block configured to temporarily store commands input to the controller 1102 or control signals output by the controller 1102 or store required data. The memory block 1108 may include a memory, such as a random access memory (RAM) or a read-only memory (ROM). At least one of the power supply circuit 1104 and the driver block 1106 may include at least one of the IC devices 100, 200, 300, 400, 500, 600, 700, and 800 described with reference to FIGS. 1A to 13G according to example embodiments or modified IC devices thereof.

Figure 16:
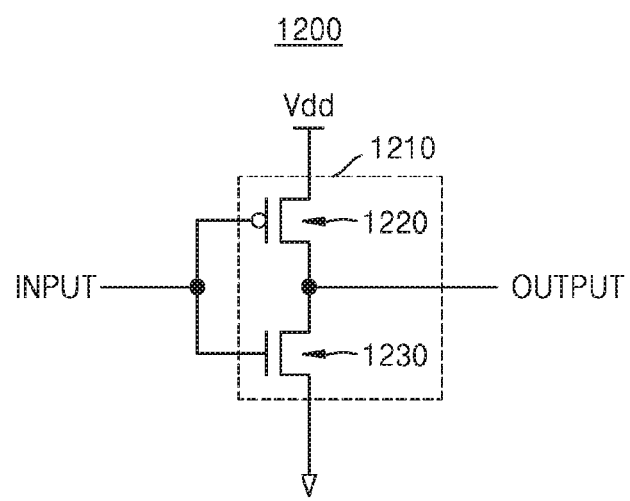
FIG. 16 is a circuit diagram of a complementary metal-oxide-semiconductor (CMOS) inverter according to example embodiments.

FIG. 16 is a circuit diagram of a complementary metal-oxide-semiconductor (CMOS) inverter 1200 according to example embodiments.

The CMOS inverter 1200 may include a CMOS transistor 1210. The CMOS transistor 1210 may include a PMOS transistor 1220 and an NMOS transistor 1230 connected between a power supply terminal Vdd and a ground terminal. The CMOS transistor 1210 may include at least one of the IC devices 100, 200, 300, 400, 500, 600, 700, and 800 described with reference to FIGS. 1A to 13G according to example embodiments or modified IC devices thereof.

Figure 17:
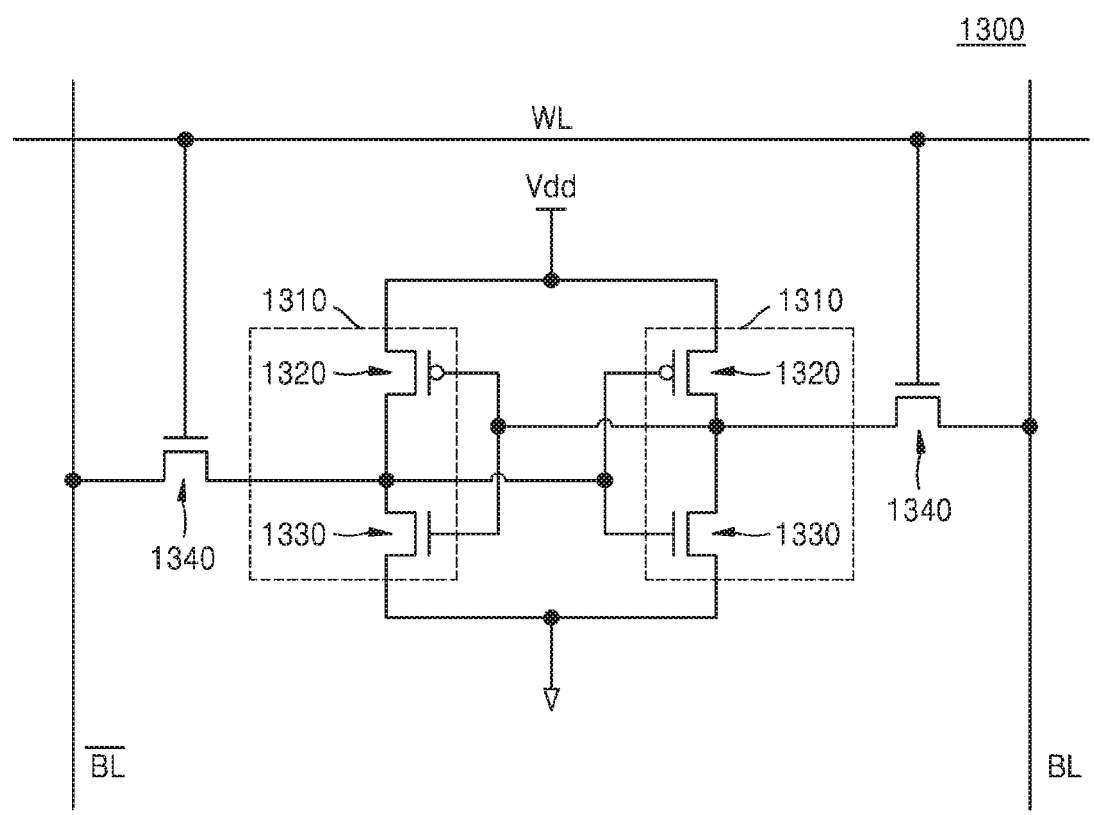
FIG. 17 is a circuit diagram of a CMOS static random access memory (SRAM) device according to example embodiments.

FIG. 17 is a circuit diagram of a CMOS static random access memory (SRAM) device 1300 according to example embodiments.

The CMOS SRAM device 1300 may include one pair of driver transistors 1310. The one pair of driver transistors 1310 may include a PMOS transistor 1320 and an NMOS transistor 1330 connected between a power supply terminal Vdd and a ground terminal. The CMOS SRAM device 1300 may further include one pair of transfer transistors 1340. A source of the transfer transistor 1340 may be cross-connected to a common node of the PMOS transistor 1320 and the NMOS transistor 1330, which may constitute the driver transistor 1310. The power supply terminal Vdd may be connected to a source of the PMOS transistor 1320, and the ground terminal may be connected to a source of the NMOS transistor 1330. A word line WL may be connected to gates of the one pair of transfer transistors 1340, and a bit line BL and an inverted bit line may be respectively connected to drains of the one pair of transfer transistors 1340.

At least one of the driver transistor 1310 and the transfer transistor 1340 of the CMOS SRAM device 1300 may include at least one of the IC devices 100, 200, 300, 400,

500, 600, 700, and 800 described with reference to FIGS. 1A to 13G according to example embodiments or modified IC devices thereof.

Figure 18:
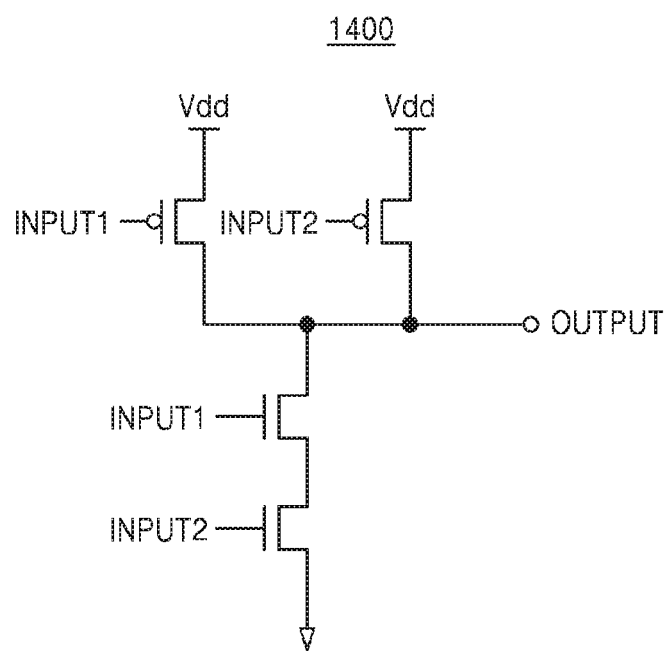
FIG. 18 is a circuit diagram of a CMOS NAND circuit according to example embodiments.

FIG. 18 is a circuit diagram of a CMOS NAND circuit 1400 according to example embodiments.

The CMOS NAND circuit 1400 may include one pair of CMOS transistors to which different input signals are transmitted. The CMOS NAND circuit 1400 may include at least one of the IC devices 100, 200, 300, 400, 500, 600, 700, and 800 described with reference to FIGS. 1A to 13G according to example embodiments or modified IC devices thereof.

Figure 19:
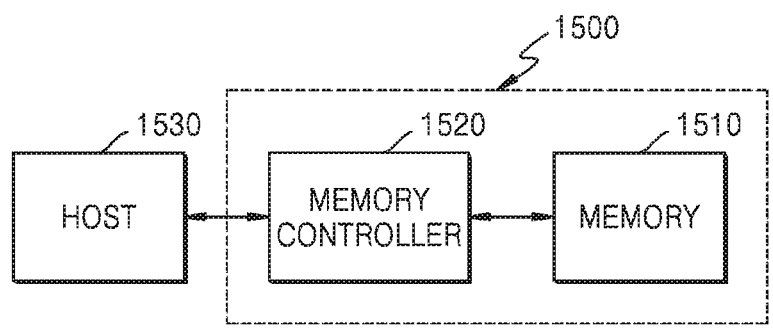
FIG. 19 is a block diagram of an electronic system according to example embodiments.

FIG. 19 is a block diagram of an electronic system 1500 according to example embodiments.

The electronic system 1500 may include a memory 1510 and a memory controller 1520. The memory controller 1520 may control the memory 1510 to read data from the memory 1510 and/or write data to the memory 1510 in response to a request from a host 1530. At least one of the memory 1510 and the memory controller 1520 may include at least one of the IC devices 100, 200, 300, 400, 500, 600, 700, and 800 described with reference to FIGS. 1A to 13G according to example embodiments or modified IC devices thereof.

Figure 20:
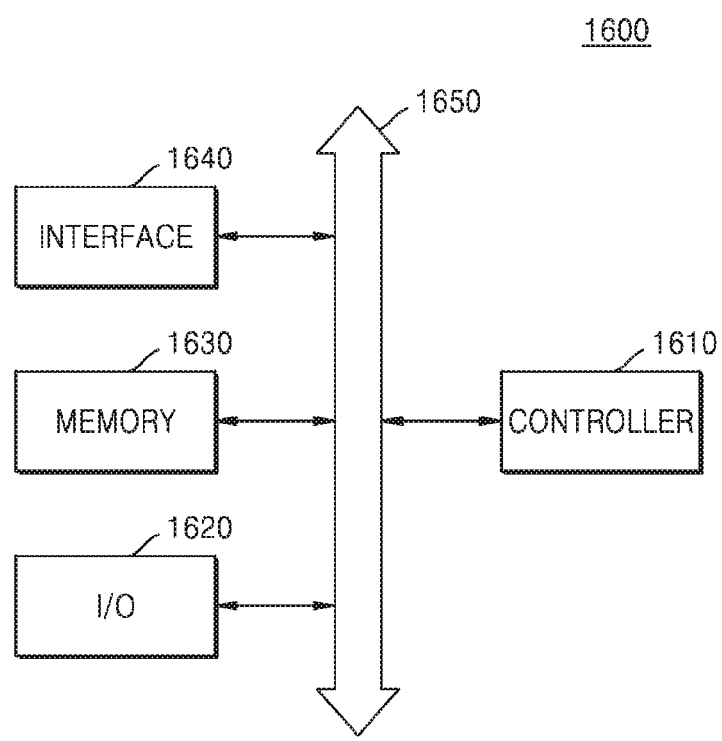
FIG. 20 is a block diagram of an electronic system according to example embodiments.

FIG. 20 is a block diagram of an electronic system 1600 according to example embodiments.

The electronic system 1600 may include a controller 1610, an input/output (I/O) device 1620, a memory 1630, and an interface 1640, which may be connected to one another by a bus 1650.

The controller 1610 may include at least one of a microprocessor (MP), a digital signal processor (DSP), and processors similar thereto. The I/O device 1620 may include at least one of a keypad, a keyboard, or a display. The memory 1630 may be used to store commands executed by the controller 1610. For example, the memory 1630 may be used to store user data.

The electronic system 1600 may be a wireless communication device or a device capable of transmitting and/or receiving information in wireless environments. The interface 1640 may include a wireless interface so that the electronic system 1600 may transmit or receive data through a wireless communication network. The interface 1640 may include an antenna and/or a wireless transceiver. In example embodiments, the electronic system 1600 may be used for a communication interface protocol of a third-generation communication system, for example, code division multiple access (CDMA), global system for mobile communications (GSM), north American digital cellular (NADC), extended-time division multiple access (E-TDMA), and/or wide band code division multiple access (WCDMA). The electronic system 1600 may include at least one of the IC devices 100, 200, 300, 400, 500, 600, 700, and 800 described with reference to FIGS. 1A to 13G according to example embodiments or modifications thereof.

It should be understood that example embodiments described herein should be considered in a descriptive sense only and not for purposes of limitation. Descriptions of features or aspects within each device or method according to example embodiments should typically be considered as available for other similar features or aspects in other devices or methods according to example embodiments. While some example embodiments have been particularly shown and described, it will be understood by one of ordinary skill in the art that variations in form and detail may be made therein without departing from the spirit and scope of the claims.

What is claimed is:

1. An integrated circuit (IC) device comprising:
a substrate including a fin-type active region formed in the substrate,
the fin-type active region protruding from the substrate and extending in a first direction parallel to a main surface of the substrate,
the fin-type active region including a channel region having a first conductivity type,
the fin-type active region including a stepped portion on at least one sidewall thereof;
a step insulation layer on the at least one sidewall of the fin-type active region,
the step insulation layer contacting the stepped portion of the fin-type active region; and
a first high-level isolation layer on the at least one sidewall of the fin-type active region with the step insulation layer between the first high-level isolation layer and the at least one sidewall of the fin-type active region,
the first high-level isolation layer extending in a second direction that is different from the first direction.

2. The IC device of claim 1, wherein a top surface of the step insulation layer is at a level that is equal to or higher than a top surface of the fin-type active region.

3. The IC device of claim 1, wherein a top surface of the first high-level isolation layer is at a level that is higher than or equal to a top surface of the fin-type active region.

4. The IC device of claim 1, further comprising:
a first low-level isolation layer on a lower sidewall of the fin-type active region, wherein
the first low-level isolation layer extends in the first direction, and
a top surface of the first low-level isolation layer is at a level that is lower than a top surface of the fin-type active region.

5. The IC device of claim 1, further comprising:
a first low-level isolation layer on a lower sidewall of the fin-type active region, wherein a top level of the first high-level isolation layer is higher than a top level of the first low-level isolation layer.

6. The IC device of claim 1, wherein at least one of the step insulation layer and the first high-level isolation layer include an oxide capable of applying a tensile stress to the fin-type active region.

7. The IC device of claim 1, wherein the step insulation layer includes:
an insulation liner on the at least one sidewall of the fin-type active region, the insulation liner contacting the stepped portion of the fin-type active region; and
a gap-fill insulating layer between the insulation liner and the first high-level isolation layer.

8. The IC device of claim 1, further comprising:
a normal gate on the fin-type active region; and
a first dummy gate on the first high-level isolation layer, wherein
the normal gate and the first dummy gate each extend in the second direction, and
the second direction is different than the first direction.

9. The IC device of claim 1, wherein the channel region is an NMOS channel region.

10. The IC device of claim 1, wherein
the fin-type active region includes two first sidewalls and two second sidewalls,
the two first sidewalls extend in the first direction,
the two second sidewalls extend in the second direction,
the first sidewalls have a first width, the second sidewalls have a second width that is less than the first width, and the stepped portion is formed in at least one of the two second sidewalls of the fin-type active region.

11. The IC device of claim 10, wherein the stepped portion is formed in each of the two second sidewalls of the fin-type active region.

12. An IC device comprising:
a substrate including one pair of first fin-type active regions and one pair of second fin-type active regions,
the first fin-type active regions having a first-conductivity-type channel region,
the first fin-type active regions being formed in a straight line in a first region of the substrate,
the second fin-type active regions having a second-conductivity-type channel region,
the second fin-type active regions being formed in a straight line in a second region of the substrate,
at least one first fin-type active region of the one pair of first fin-type active regions including a stepped portion on one sidewall thereof;
a first high-level isolation layer on the substrate between the one pair of first fin-type active regions;
a step insulation layer on the substrate between the at least one first fin-type active region and the first high-level isolation layer,
the step insulation layer contacting the stepped portion; and
a second high-level isolation layer on the substrate between the one pair of second fin-type active regions.

13. The IC device of claim 12, wherein a top surface of the first high-level isolation layer is at a higher level than a top surface of the second high-level isolation layer.

14. The IC device of claim 12, further comprising:
at least one first normal gate on the one pair of first fin-type active regions and extending in a direction that intersects an extension direction of the one pair of first fin-type active regions;
at least one first dummy gate on at least a portion of the first high-level isolation layer and extending in a direction parallel to the at least one first normal gate;
at least one second normal gate on the one pair of second fin-type active regions and extending in a direction that intersects an extension direction of the one pair of second fin-type active regions; and
at least one second dummy gate on at least a portion of the second high-level isolation layer and extending in a direction parallel to the at least one second normal gate.

15. The IC device of claim 14, wherein a bottom surface of the at least one first dummy gate is at a higher level than a bottom surface of the at least one second dummy gate.

16. An integrated circuit (IC) device comprising:
a substrate including a plurality of first fin-type active regions formed in the substrate,
the first fin-type active regions being defined by first and second trenches formed in the substrate,
the first trenches and second trenches extending in first and second directions, respectively, that cross each other,
the first fin-type active regions being elongated in the first direction,
the first fin-type active regions each including a pair of first sidewalls opposite each other in the first direction and a pair of second sidewalls opposite each other in the second direction,
at least one of the second sidewalls including a stepped portion,
the first fin-type active regions each including a lower portion below the stepped portion and an upper portion that protrudes above the stepped portion;
a first high-level isolation layer in the second trenches; and
a step insulation layer on the stepped portion,
the step insulation layer between the first high-level isolation layer and the upper portions of the first fin-type active regions.

17. The IC device of claim 16, further comprising:
a gate structure extending in the second direction and crossing over the first fin-type active regions, wherein
the first fin-type active regions include a NMOS channel between source and drain regions,
the gate structure crossing over the NMOS channel, and
the gate structure including a gate electrode on a gate insulating layer.

18. The IC device of claim 16, further comprising:
a dummy gate extending in the second direction, wherein the dummy gate crosses over the stepped portions in the first fin-type active regions.

19. The IC device of claim 16, wherein each of the second sidewalls in the first fin-type active regions include the stepped portion.

20. The IC device of claim 16, further comprising:
an insulation layer between the step insulation layer and the stepped portions and upper portions of the first fin-type active regions.

* * * * *